United States Patent [19]

Nomura et al.

[11] Patent Number: 5,708,885
[45] Date of Patent: Jan. 13, 1998

[54] LIGHT INTERCEPTING DEVICE OF A LENS SHUTTER TYPE OF CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,600

[22] Filed: Jan. 9, 1997

[30] Foreign Application Priority Data

Jan. 26, 1996 [JP] Japan ................... 8-012317
Feb. 19, 1996 [JP] Japan ................... 8-031079

[51] Int. Cl.$^6$ ................................................ G03B 9/00
[52] U.S. Cl. ................... 396/355; 396/451; 396/462; 396/494
[58] Field of Search ...................... 396/72, 89, 355, 396/451, 462, 493, 494

[56] References Cited

U.S. PATENT DOCUMENTS

| | | | |
|---|---|---|---|
| 4,944,030 | 7/1990 | Haraguchi et al. | 396/62 |
| 5,033,819 | 7/1991 | Tanaka | 396/89 |
| 5,034,762 | 7/1991 | Kohmoto | 396/72 |
| 5,153,626 | 10/1992 | Yamamoto | 396/72 |
| 5,376,983 | 12/1994 | Yamazaki et al. | 396/72 |

FOREIGN PATENT DOCUMENTS

| | | |
|---|---|---|
| 944627 | 12/1963 | United Kingdom . |
| 1017421 | 1/1966 | United Kingdom . |

*Primary Examiner*—Eddie C. Lee
*Attorney, Agent, or Firm*—Greenblum & Bernstein, P.L.C.

[57] ABSTRACT

A shutter arrangement for a camera which includes a plurality of shutter blades each having a rotational center and an opening formed proximate to the rotational center, a supporting member which supports each of the plurality of shutter blades to be rotatable about the rotational center and a ring member driven to rotate about an optical axis of a photographic lens. The ring member includes a plurality of pins each engaging with a corresponding one of the openings. A light intercepting sheet is also provided which includes a plurality of holes in which the plurality of pins are respectively inserted, so that the ring member and the light intercepting sheet rotate together as a whole about the optical axis when the ring member is driven to rotate.

13 Claims, 22 Drawing Sheets

LIGHT INTERCEPTING DEVICE OF A LENS SHUTTER TYPE OF CAMERA

BACKGROUND OF THE INVENTION

1. Field of the Invention

The present invention relates to a light intercepting device of a lens shutter type of camera which prevents unwanted light from passing through a lens shutter of the camera.

2. Description of the Related Art

Conventional lens shutter-type cameras are well known in which each of a plurality of shutter blades of a lens shutter is pivoted and biased by a spring in a rotational direction to close a diaphragm. The shutter blades are opened against the biasing force of the spring by energizing an electrical magnet and subsequently closed by de-energizing the electrical magnet when the shutter is released. In such lens shutter type cameras, a mechanism for driving the shutter is also known in which a shutter blade supporting plate is provided having a plurality of slots corresponding to the number of shutter blades. A drive pin is inserted in each slot to engage with the corresponding shutter blade. Each drive pin moves the corresponding shutter blade. The shutter blades are opened and closed when the drive pins are moved along the slits by energizing and de-energizing the electrical magnet, respectively.

In such a driving mechanism, it is necessary to prevent unwanted light from passing through the slits of the shutter blade supporting plate when the shutter is in a fully closed state. For this purpose, a light intercepting member, such as a piece of black cellophane, black paper or the like, which covers the slits can be provided. However, employing such a light intercepting member makes it difficult and troublesome to assemble the shutter and its associated peripheral parts. In addition, it may be difficult to completely prevent unwanted light from passing through the slits.

SUMMARY OF THE INVENTION

An object of the present invention is to provide a light intercepting device of a lens shutter type of camera in which unwanted light is prevented from coming through the slits formed on the supporting plate when the shutter is in a fully closed state.

To achieve the object mentioned above, according to an aspect of the present invention, there is provided a shutter arrangement for a camera which includes a plurality of shutter blades each being provided with a rotational center and an opening formed in a vicinity of the rotational center, a supporting member which supports each of the plurality of shutter blades to be rotatable about the rotational center, and a ring member driven to rotate about an optical axis of a photographic lens. The ring member is provided with a plurality of pins, each of which engaging with a corresponding one of the openings. A light intercepting sheet is also provided which has a plurality of holes in which the plurality of pins are respectively inserted, so that the ring member and the light intercepting sheet rotate together as a whole about the optical axis when the ring member is driven to rotate.

Preferably, each of the plurality of holes is smaller than a corresponding one of the openings.

Preferably, the light intercepting sheet is formed in the shape of a ring which surrounds a photographic light path of the photographic lens.

Preferably, the shutter arrangement further includes a plurality of pivotal shafts formed on the supporting member, and a plurality of pivotal holes each formed on a corresponding one of the rotational centers of the plurality of shutter blades. The plurality of pivotal shafts are respectively inserted in the plurality of pivotal holes.

According to another aspect of the present invention, there is provided a shutter arrangement for a camera which includes a shutter supporting annular member having a plurality of pivotal shafts extending in a direction of an optical axis of the photographic lens, a plurality of shutter blades each pivoted at a corresponding one of the plurality of pivotal shafts and each including an elongated hole, and a ring member driven to rotate about the optical axis. The ring member is provided with a plurality of pins each engaging with a corresponding one of the elongated holes. A ring-shaped light intercepting sheet is provided which has a plurality of holes in which the plurality of pins are respectively inserted, so that the ring member and the light intercepting sheet rotate together as a whole about the optical axis when the ring member is driven to rotate.

According to yet another aspect of the present invention, there is provided a shutter arrangement for a camera which includes at least one shutter blade provided with a rotational center and an opening formed in a vicinity of the rotational center, a supporting member which supports the at least one shutter blade to be rotatable about the rotational center, and a ring member driven to rotate about an optical axis of a photographic lens. The ring member is provided with at least one pin engaging with the opening. A light intercepting sheet is also provided having at least one hole in which the at least one pin is inserted, so that the ring member and the light intercepting sheet rotate together with a whole about the optical axis when the ring member is driven to rotate.

The present disclosure relates to subject matter contained in Japanese Patent Application Nos. 8-12317, filed on Jan. 26, 1996, and 8-31079, filed on Feb. 19, 1996, which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein.

DESCRIPTION OF THE PREFERRED EMBODIMENT

Figure 16:
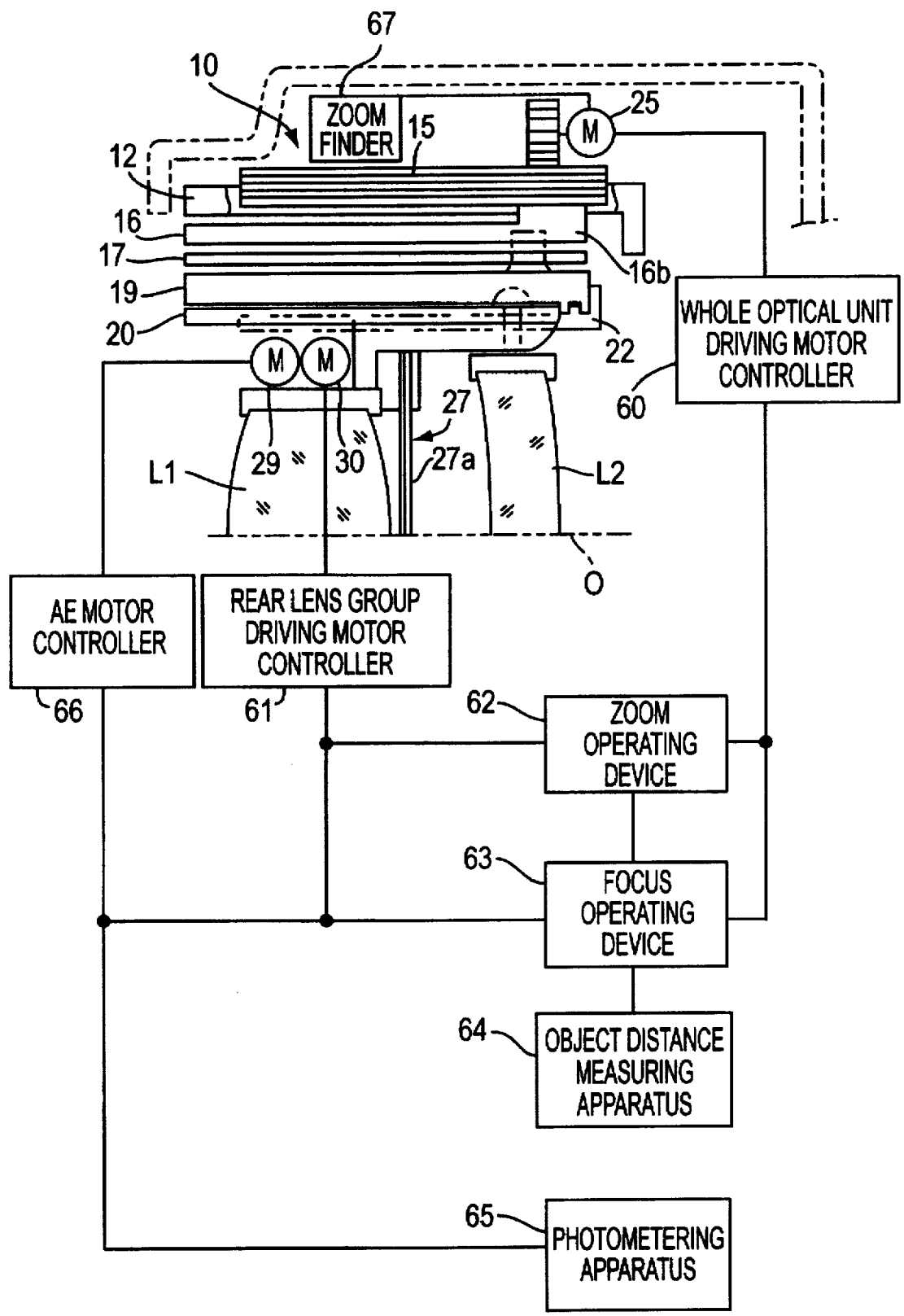
FIG. 16 is a block diagram of a controlling system for controlling an operation of the zoom lens barrel.

FIG. 16 is a schematic representation of various elements which comprise a preferred embodiment of a zoom lens camera to which the present invention is applied. A concept of the present zoom lens camera will now be described with reference to FIG. 16.

The zoom lens camera is provided with a zoom lens barrel (zoom lens) 10 of a three-stage delivery type (telescoping type) having three moving barrels, namely a first moving barrel 20, a second moving barrel 19 and a third moving barrel (rotational barrel) 16, which are concentrically arranged in this order from an optical axis O. In the zoom lens barrel 10, two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used.

Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button (not shown) provided on the camera body. When the zoom operation device 62 is operated, the whole optical unit driving motor controller 60 drives a whole optical unit driving motor 25 to move the front lens group L1 and the rear lens group L2, rearwardly or forwardly without regard to a focal length and a focal point thereof. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in accordance with the variation of the focal length through the operation of the zoom operating device 62. Therefore, the photographer can perceive the variation of the focal length by observing the variation of image magnification of the visual field of the finder. In addition, the focal length, as set by the operation of the zoom operating device 62, may be a value indicated by a value on an LCD (liquid crystal display) panel (not shown) or the like.

When the focus operating device 63 is operated, the whole optical unit driving motor controller 60 drives the whole optical unit driving motor 25. At the same time, the rear lens group driving motor controller 61 drives a rear lens group driving motor 30. The driving of the whole optical unit driving motor controller 60 and the rear lens group driving motor controller 61 causes the front and rear lens groups L1 and L2 to be moved to respective positions corresponding to a set focal length and a detected object distance, thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 turns the photometering switch ON, and the object distance measuring and photometering commands are respectively input to the object distance measuring apparatus 64 and the photometering apparatus 65.

When the release button is fully depressed (full step), the focus operating device 63 turns the release switch ON, and according to the result of the object distance measurement and a set focal length, the whole optical unit driving motor 25 and the rear lens group driving motor 30 are driven, and the focusing operation is executed, in which the front lens group L1 and the rear lens group L2 move to the focusing position. Further, an AE motor 29 of an AF/AE (i.e., autofocus/autoexposure) shutter unit (electrical unit) 21 (FIG. 14) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operative device 62 is operated, the zoom operating device 62 drives the whole optical unit driving motor 25 to move the front and rear lens groups L1 and L2 together as a whole in the direction of the optical axis O (optical axis direction). The rear lens group driving motor 30 may also be driven via the rear lens group driving motor controller 61 to move the rear lens group L2 relative to the first lens group L1. However, this may not be performed under the conventional concept of zooming in which the focal length is varied sequentially without moving the position of the focal point.

When the zoom operating device 62 is operated, the following two modes are available:

1. A mode to move the front lens group L1 and the rear lens group L2 in the optical axis direction without varying the distance therebetween by driving only the whole optical unit driving motor 25; and
2. A mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, in a lens-shutter type camera, since the image of the subject is not observed through the photographing optical system, but through the finder optical system provided separately from the photographing optical system, it is sufficient that the subject is only focused when the shutter is released. In mode 2, during a zooming operation the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined in accordance with subject distance information provided from the object distance measuring apparatus 64, and focal length information set by the zoom operating device 62. By moving both the whole optical unit driving motor 25 and the rear lens group driving motor 30 when the focus operating device 63 is operated, the position of the lens groups L1, L2 can be flexibly controlled in comparison to lens movements controlled by cam.

The zoom lens camera of this embodiment can also be controlled in a manner such that only the magnification of the zoom finder 67 and the focal length information are varied during an operation of the zoom operating device 62, without driving either the whole optical unit driving motor 25 or the rear lens group driving motor 30. Under this type of control, when the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 14 and 15.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel (cam ring or second barrel) 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

Figure 14:
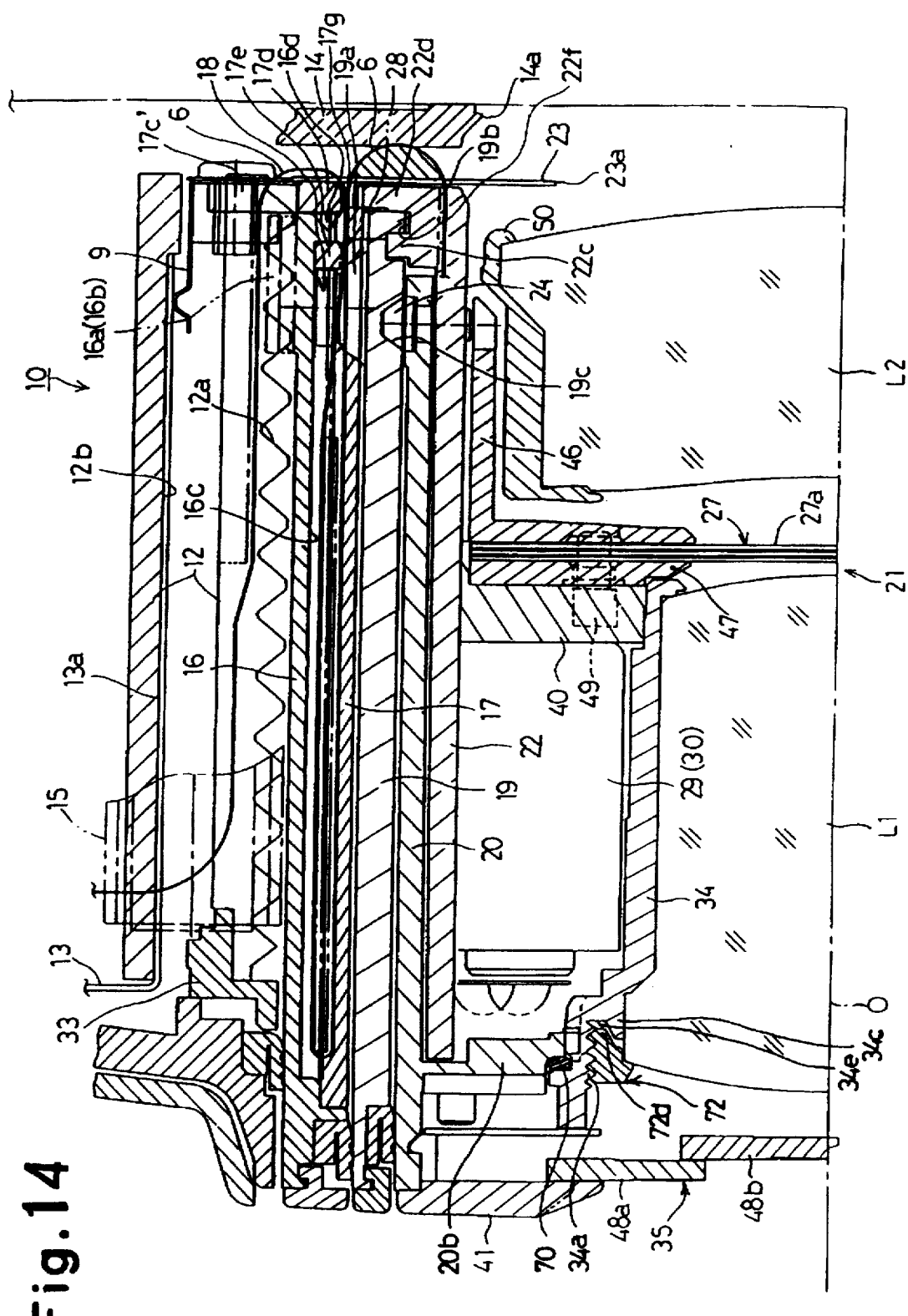
FIG. 14 is a sectional view of an upper part of the zoom lens barrel in the housed state.

An O-ring 70, made of a rubber or the like, is positioned between an outer peripheral circumferential surface of the front end of the lens supporting barrel 34, and an inner peripheral circumferential surface of an inner flange portion 20b integrally formed in the front end of the first moving barrel 20 as shown in FIG. 14. The O-ring 70 prevents water from penetrating the zoom lens barrel 10 at the front end thereof between the first moving barrel 20 and the lens supporting barrel 34.

Figure 20:
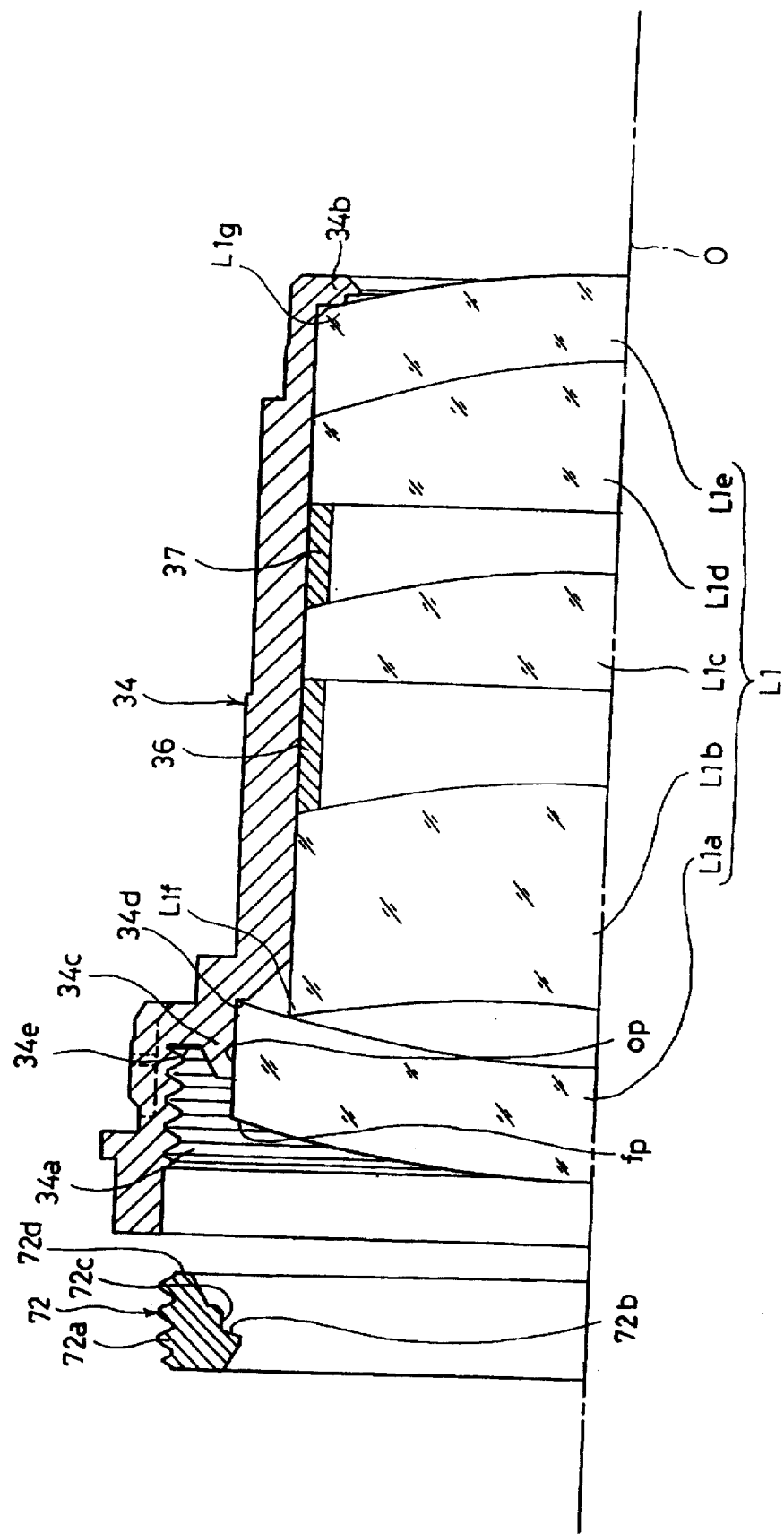
FIG. 20 is a sectional view of an upper part of lens supporting barrel which supports a front lens group therein, and a lens fixing ring which is to be screw-engaged with the lens supporting barrel.

As shown in FIG. 20, the front lens group L1 consists of five lenses, namely a first lens (frontmost lens) L1a, a second lens L1b, a third lens L1c, a fourth lens L1d and a fifth lens L1e in this order from an object side to an image side, i.e., from the left hand side to the right hand side as viewed in FIG. 20.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge thereof contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

Figure 21:
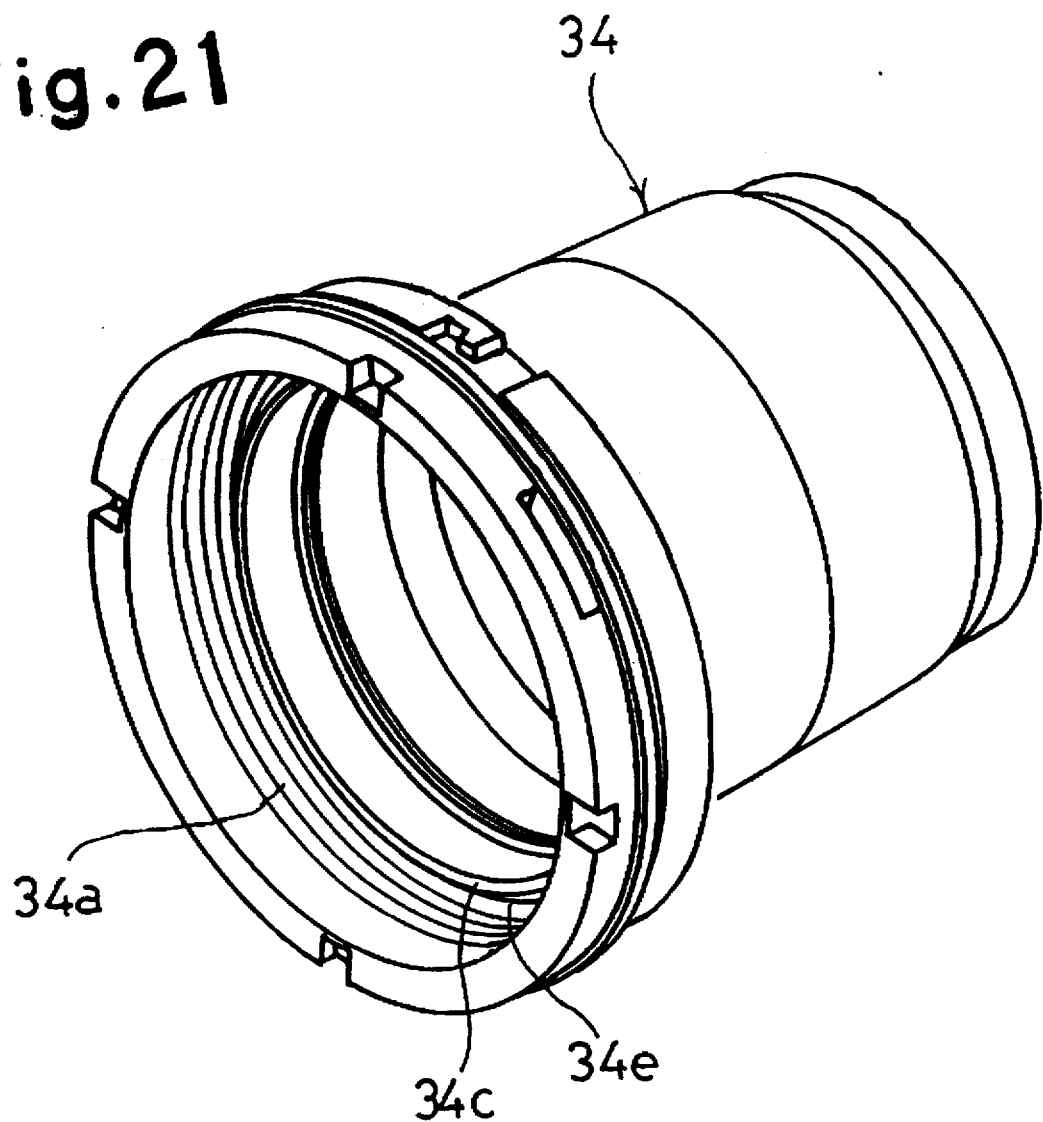
FIG. 21 is an enlarged perspective view of the lens supporting barrel shown in FIG. 20.

A female thread 34a is formed on an inner periphery of a front part of the lens supporting barrel 34, as shown in FIGS. 20 or 21. A lens fixing ring 72, for fixing the first lens L1a to the lens support barrel 34, engages with the lens supporting barrel 34. With this arrangement, a male thread 72a formed on the outer peripheral surface of the lens fixing ring 72 meshes with the female thread 34a. A circular abutting surface 72b is formed on the lens fixing ring 72 on an inner peripheral surface thereof. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought into contact with each other when the lens fixing ring 72 is properly screw-engaged with the lens supporting barrel 34.

A supporting ring portion 34c is formed integral with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis O, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis O.

Figure 22:
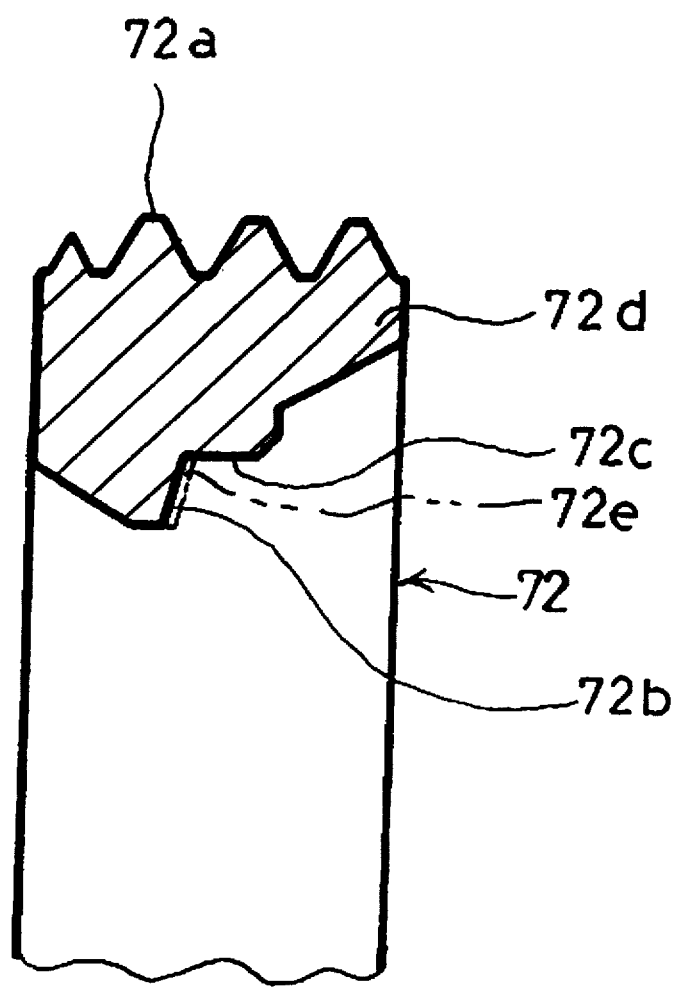
FIG. 22 is an enlarged sectional view of a part of the lens fixing ring shown in FIG. 20.

As shown in FIG. 22, a coating 72e is coated on the circular abutting surface 72b. The coating 72e is a waterproof coating made of a synthetic resin. In the present embodiment, Fantas Coat SF-6 (trademark of a coating produced by the Japanese Company "Origin Denki Kabushiki Kaisha") is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Because of the differences in the finishes, in the absence of the coating 72e on the circular abutting surface 72b, a substantial gap would be formed between the circular abutting surface 72b and the circumferential portion fp. This would be the case even if the circular abutting surface 72b was properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which eliminates the substantial gap between the circular abutting surface 72b and the circumferential portion fp when the circular abutting surface 72b properly contacts the circumferential portion fp. Accordingly, the coating 72e, positioned and held between the circular abutting surface 72b and the circumferential portion fp, effectively prevents water or moisture from penetrating the lens supporting barrel 34 between the circular abutting surface 72b and the circumferential portion fp when the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 14, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e. In particular, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided on an inner periphery of the cylindrical portion 12p, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 10:
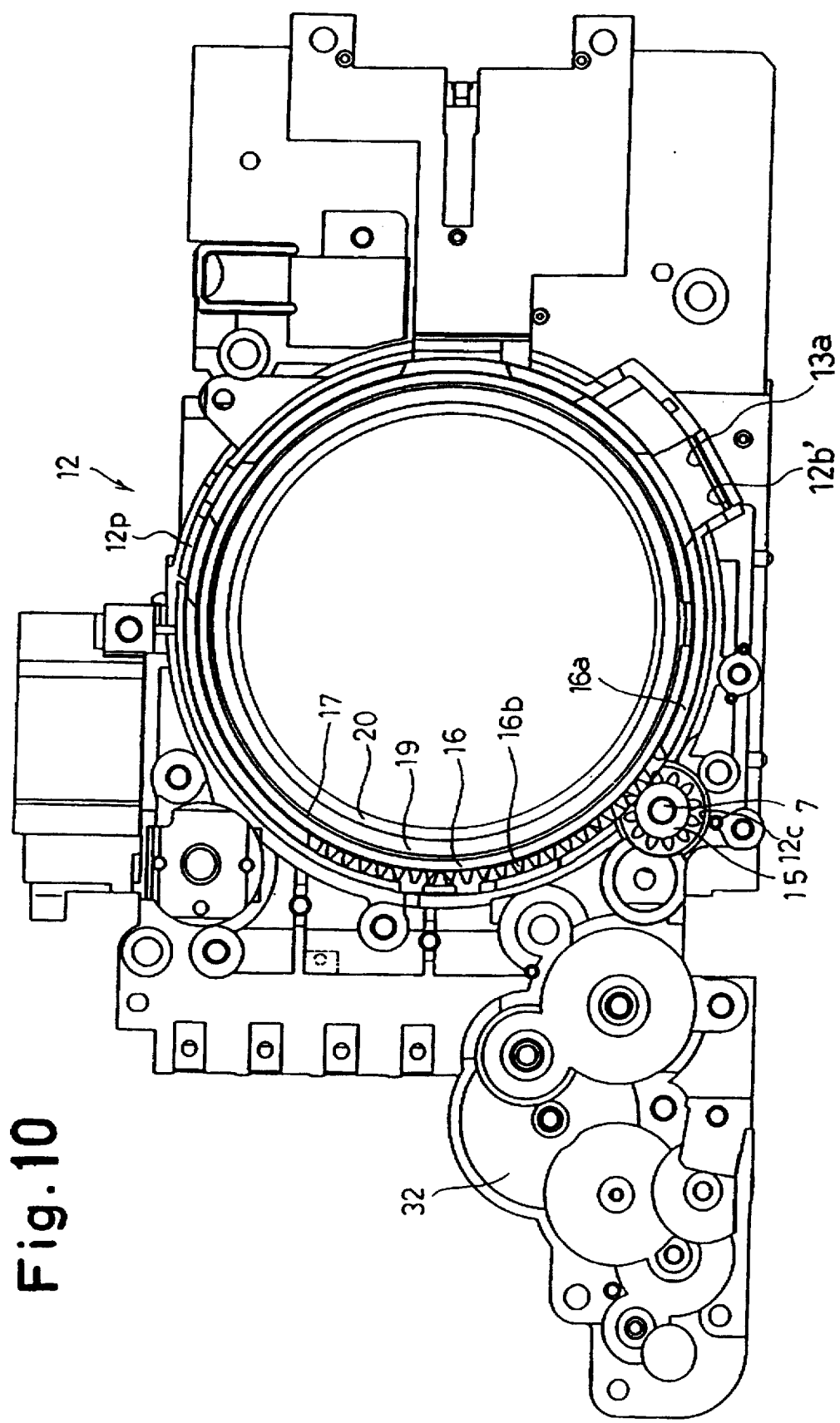
FIG. 10 is a front elevational view of a fixed lens barrel block of the zoom lens barrel.
Figure 15:
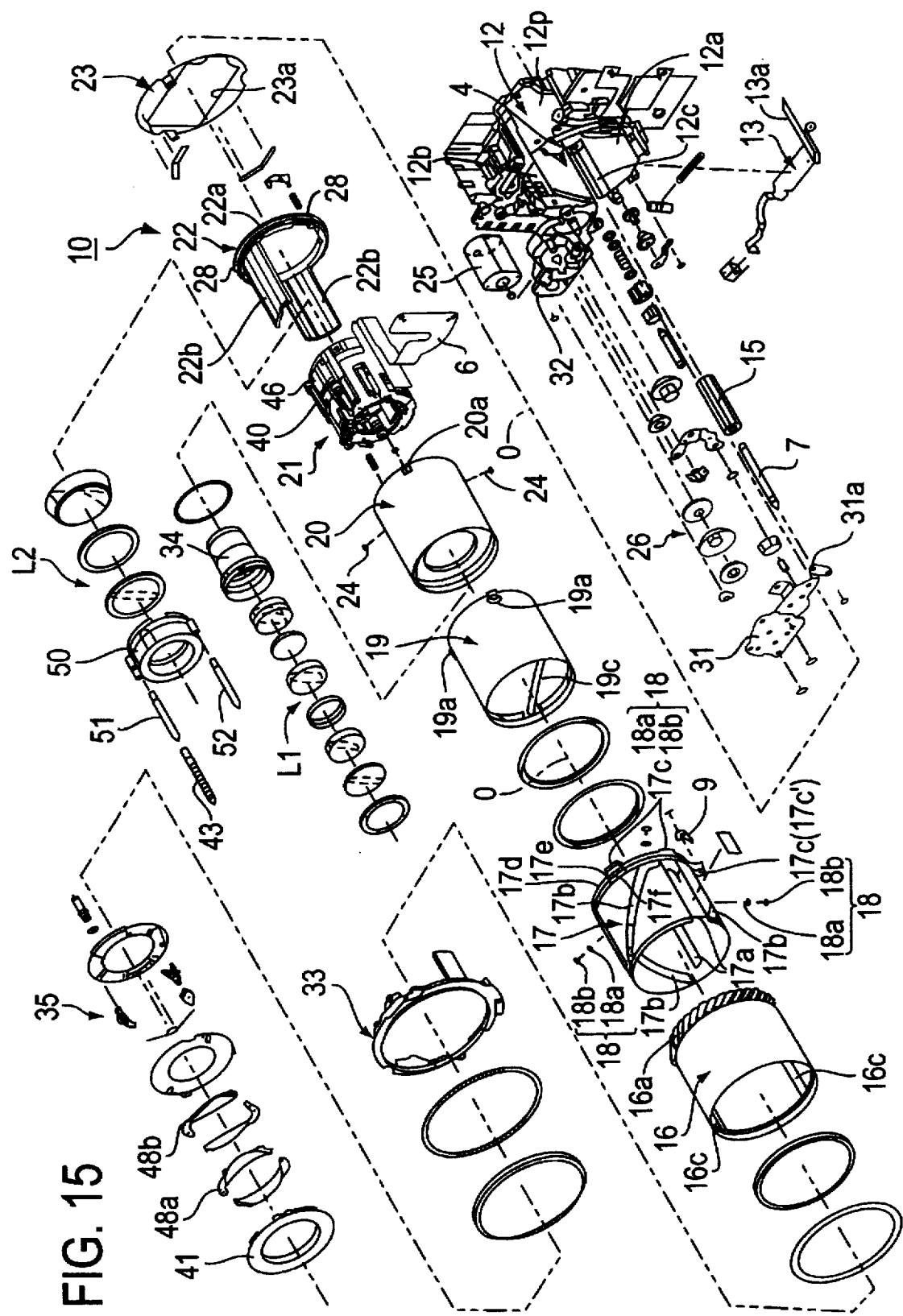
FIG. 15 is an exploded perspective view of the overall structure of the zoom lens barrel.

As shown in FIGS. 10 and 15, in the fixed lens barrel block 12, a gear housing 12c is provided which is recessed outwardly from an inner periphery of the cylindrical portion 12p of the fixed lens barrel block 12 in a radial direction while extending in the optical axis direction. In the gear housing 12c, a driving pinion 15 is rotatably held and extends in the optical axis direction. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 10.

Figure 9:
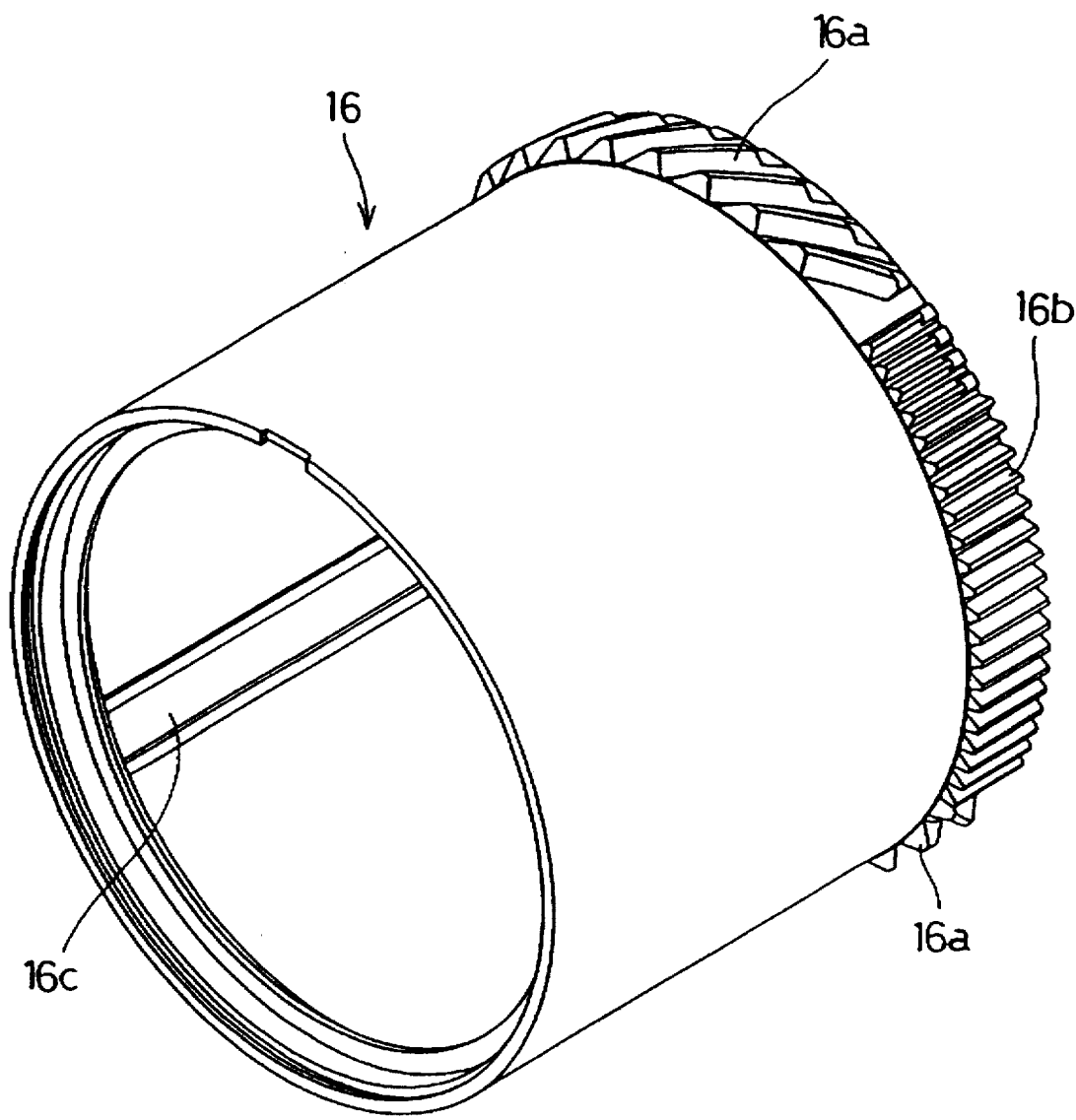
FIG. 9 is an enlarged schematic perspective view of a third moving barrel of the zoom lens barrel.

On an inner periphery of the third moving barrel 16, a plurality of linear guide grooves 16c are formed, each extending parallel to the optical axis O. At an outer periphery of the rear end of the third moving barrel 16, a male helicoid 16a and the aforementioned outer peripheral gear 16b are provided as shown in FIG. 9. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 17:
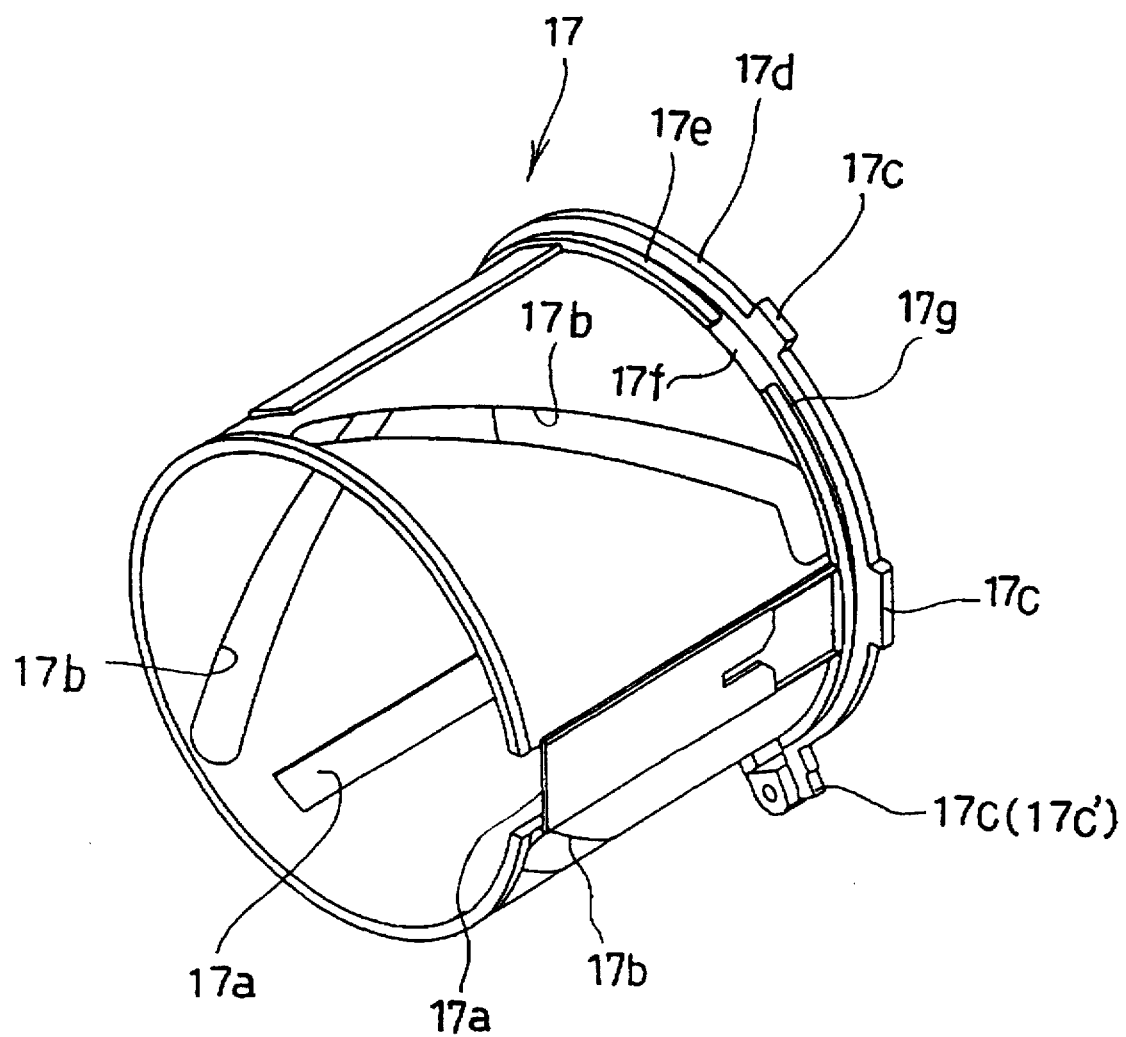
FIG. 17 is an enlarged perspective view of a linear guide barrel shown in FIG. 15.

As shown in FIG. 17, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided with a retaining flange 17e in front of the rear end flange 17d. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 14.

The third moving barrel 16 is provided, on an inner periphery of the rear end thereof, with a plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 14). By rotating the third moving barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed to the read-end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b' to generate signals corresponding to focal length information during zooming.

A plurality of linear guide grooves 17a are formed on the inner periphery of the linear guide barrel 17, each extending parallel to the optical axis O. A plurality of lead slots (cam slots) 17b are also formed on the linear guide barrel 17 as shown in FIGS. 15 or 17. The lead slots 17b are each formed oblique (inclined) to the optical axis O.

The second moving barrel 19 engages with the inner periphery of the linear guide barrel 17. On the inner periphery of the second moving barrel 19, a plurality of lead grooves 19c are provided in a direction inclined oppositely to the lead slots 17b. Each lead groove 19c is oblique to both the optical axis direction and a circumferential direction of the linear guide barrel 17 by a predetermined angle, similar to each lead slot 17b. On the outer periphery of the rear end of the second moving barrel 19, a plurality of follower projections 19a are provided. Each of the follower projections 19a has a trapezoidal cross-sectional shape projecting away from the optical axis O in a radial direction. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c. At the same time the first moving barrel 20 is guided linearly by a linear guide member 22. The first moving barrel 20 is provided at the front end thereof with a decorative plate 41.

Figure 5:
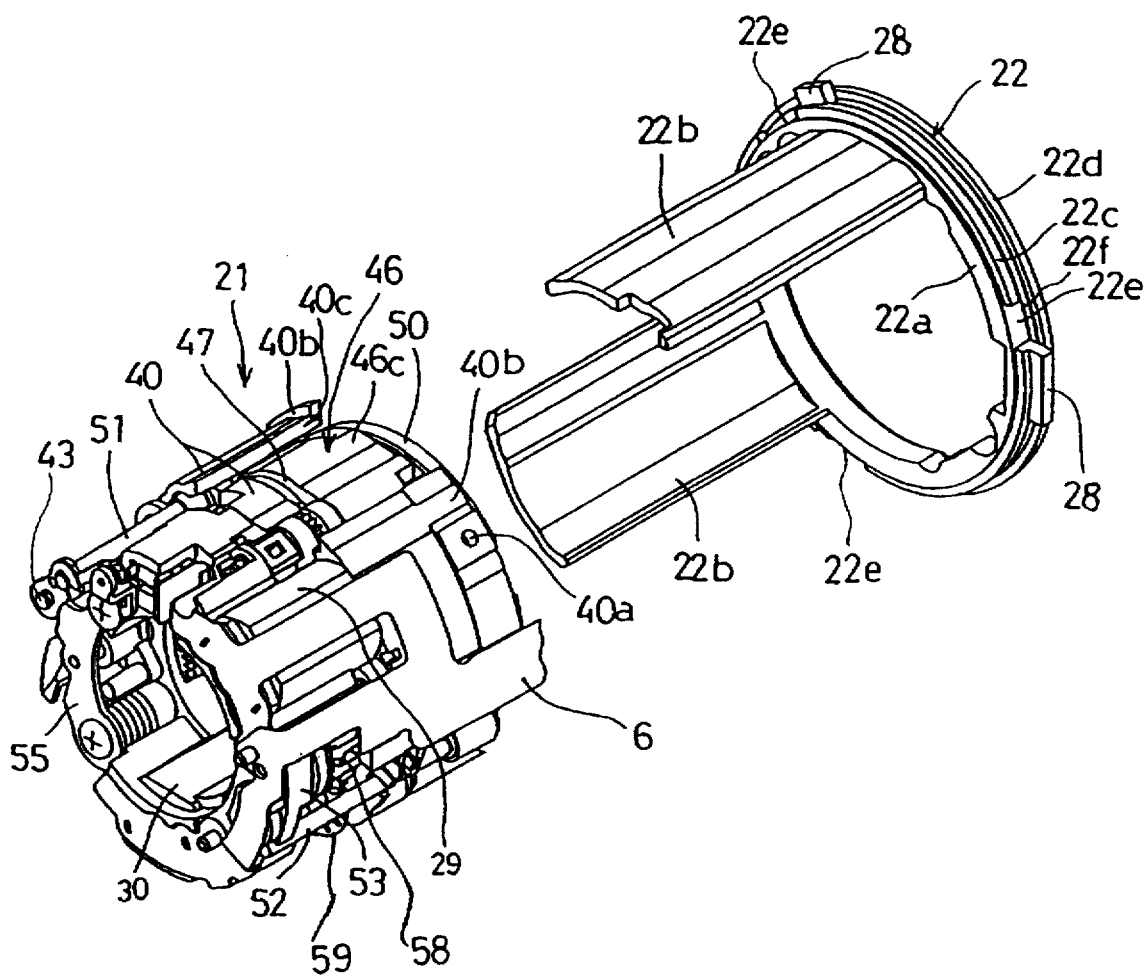
FIG. 5 is an enlarged schematic perspective view showing a part of the zoom lens barrel.
Figure 6:
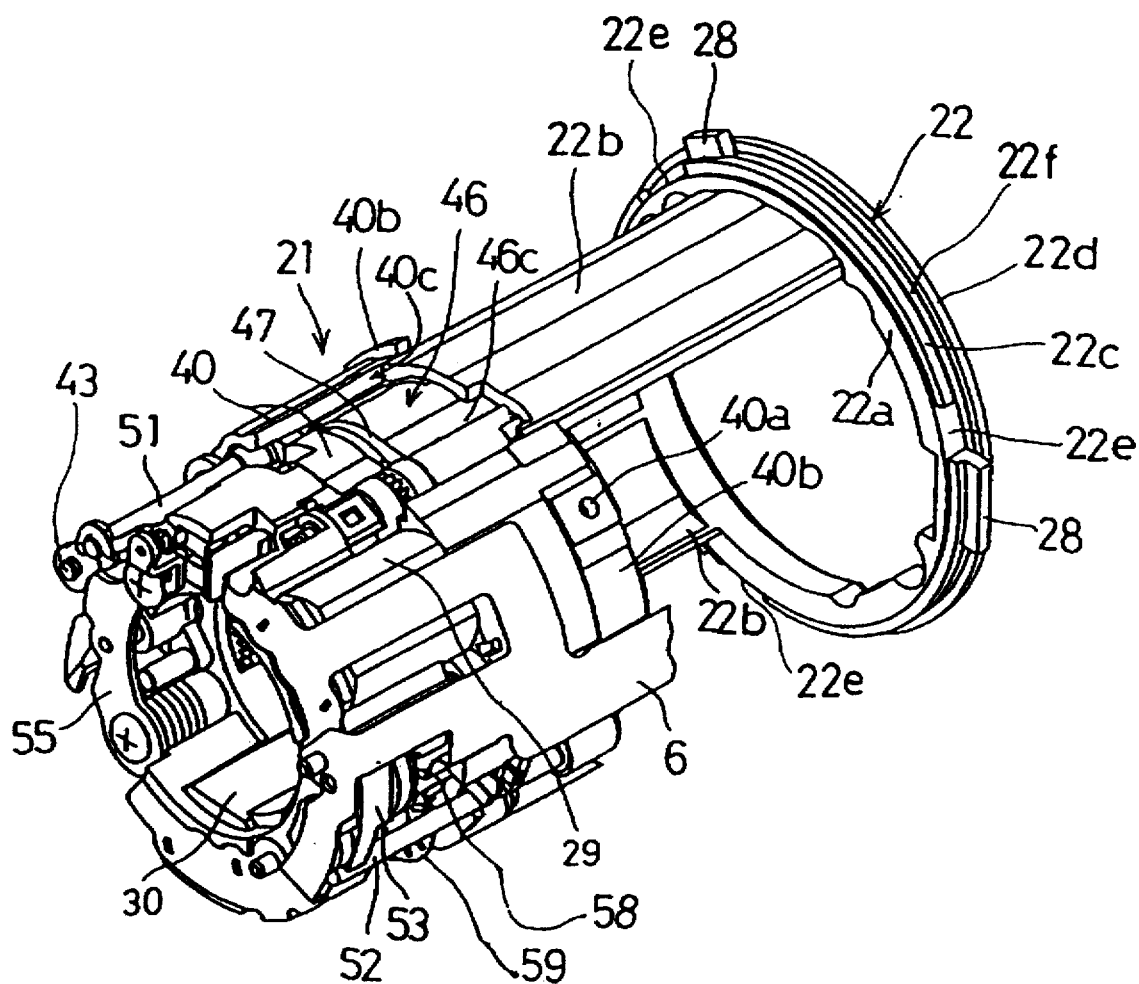
FIG. 6 is a schematic perspective view showing the part of the zoom lens barrel shown in FIG. 5 in an engaged state.
Figure 7:
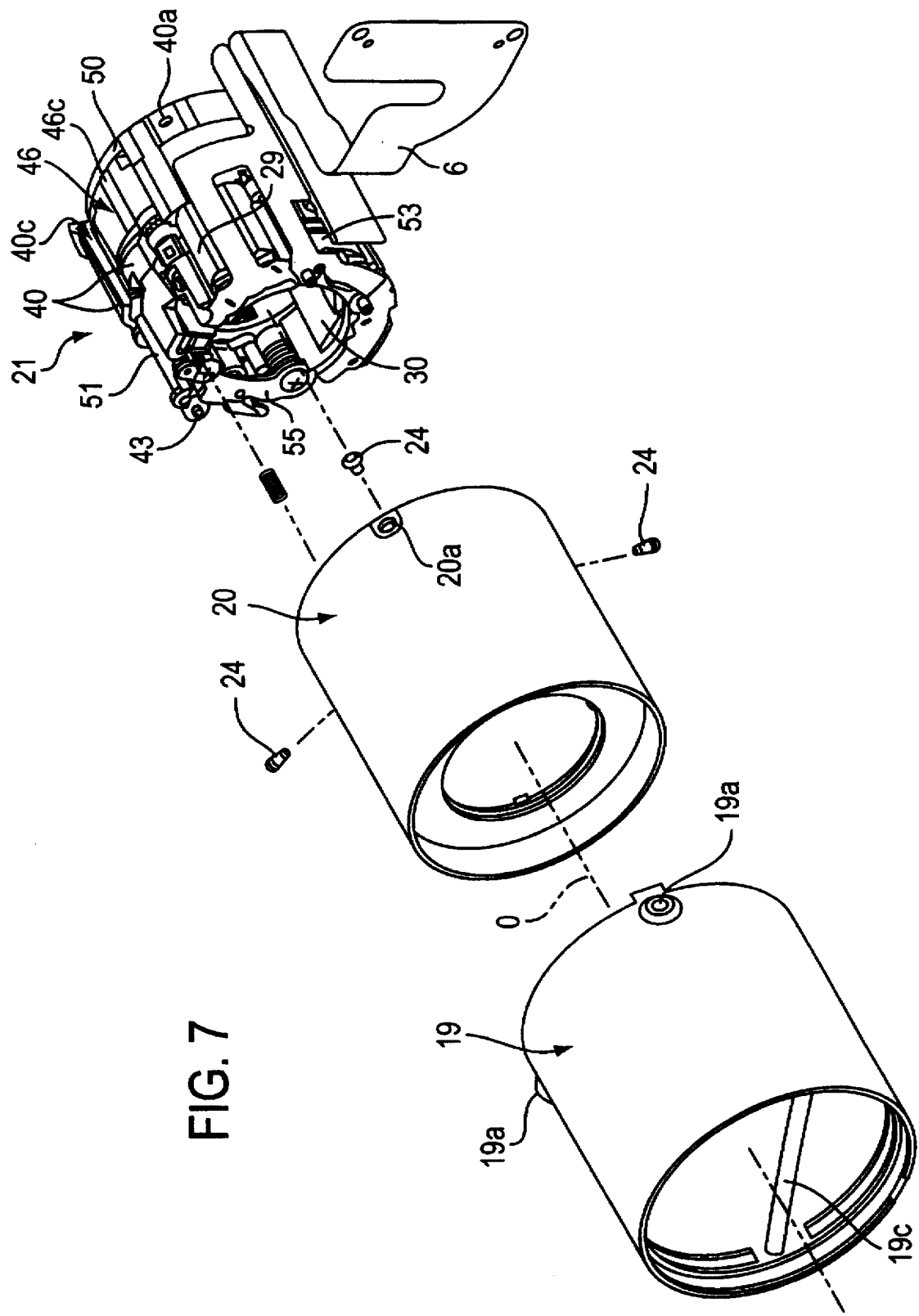
FIG. 7 is an enlarged exploded perspective view of a part of the zoom lens barrel.

As shown in FIGS. 5 and 6, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

The annular member 22a of the linear guide member 22 is connected to the rear of the second moving barrel 19, such that the linear guide member 22 and the second moving barrel 19 are capable of moving along the optical axis O as a whole and relatively rotating around the optical axis O. The linear guide member 22 is further provided on the outer periphery of the rear end thereof with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a smaller radius than the rear end flange 22d. The retaining flange 22c is provided with a plurality of cutout portions 22e, as shown in FIGS. 5 or 6, each allowing a corresponding engaging projection 19b to be inserted into the circumferential groove 22f, as shown in FIG. 14.

The second moving barrel 19 is provided on an inner periphery of the rear end thereof with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly forwardly or rearwardly along the optical axis O, but is restricted from rotating.

Figure 12:
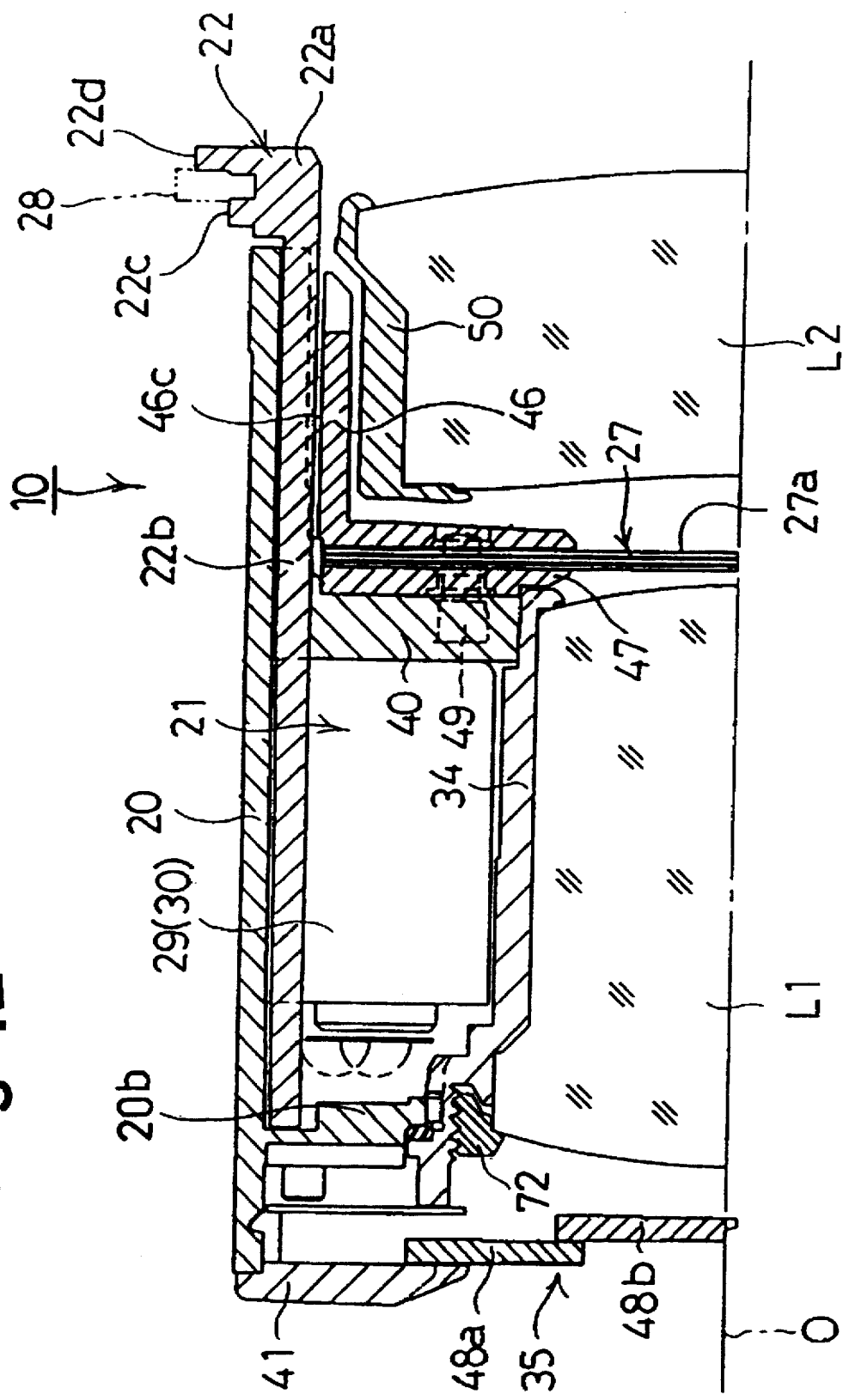
FIG. 12 is a sectional view of an upper part of the zoom lens barrel, illustrating essential elements in a housed state.

At the front of the first moving barrel 20, a barrier apparatus 35 having barrier blades 48a and 48b is mounted. On an inner peripheral face of the first moving barrel 20, the AF/AE shutter unit 21 having the shutter 27, consisting of three shutter blades 27a, is engaged and fixed as shown in FIG. 12. The AF/AE shutter unit 21 is provided with a plurality of fixing holes 40a formed at even angular intervals on the outer periphery of the shutter mounting stage 40. Only one of the fixing holes 40a appears in each of FIGS. 1 and 5–8.

Figure 8:
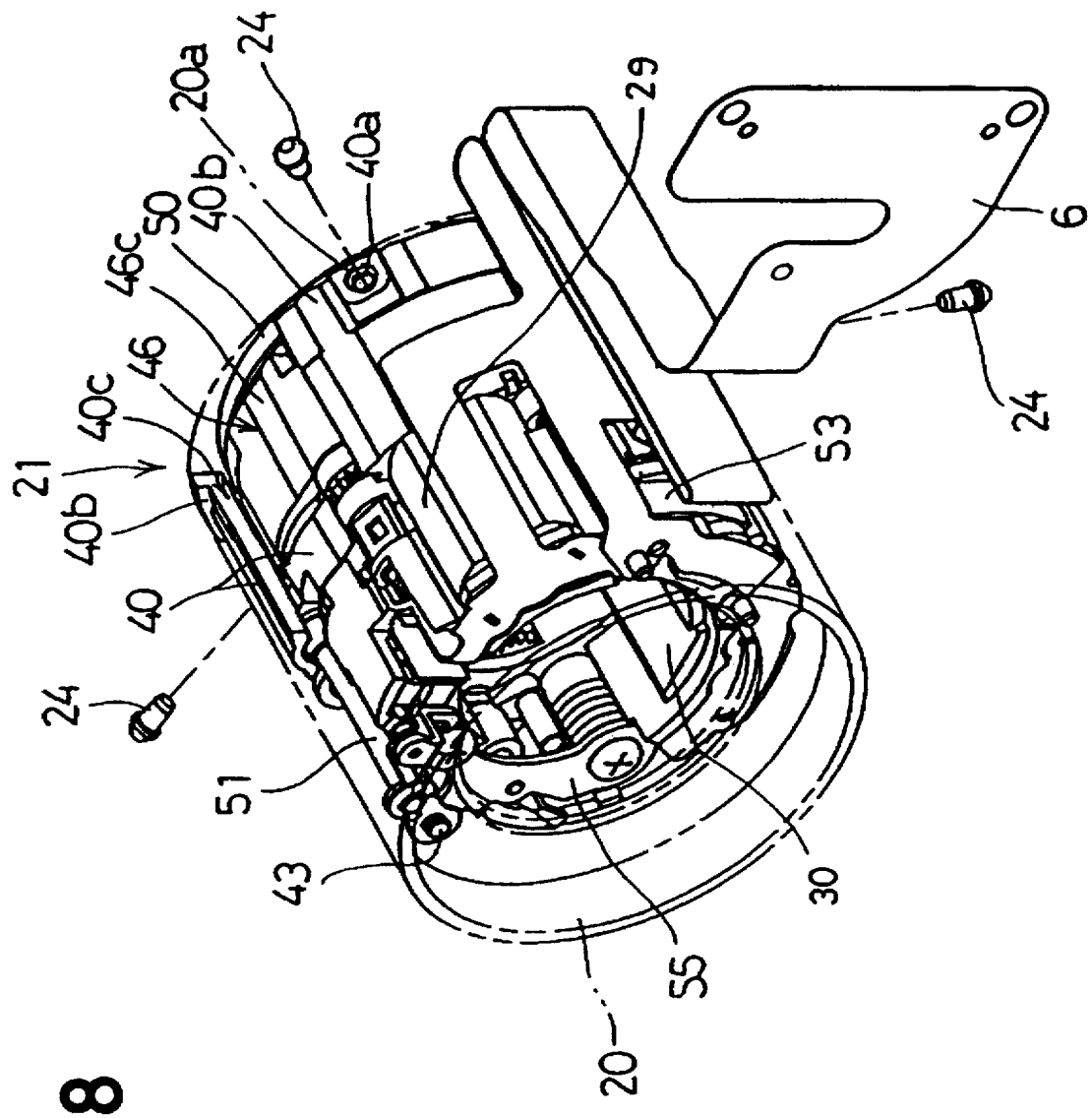
FIG. 8 is a schematic perspective view illustrating a state where an AF/AE shutter unit of the zoom lens barrel is mounted to a first moving barrel.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 8. In FIG. 8 the first moving barrel 20 is indicated by phantom lines. The follower pins 24 may be fixed by an adhesive, or the pins 24 may be formed as screws to be screwed into the fixing holes 40a.

Figure 1:
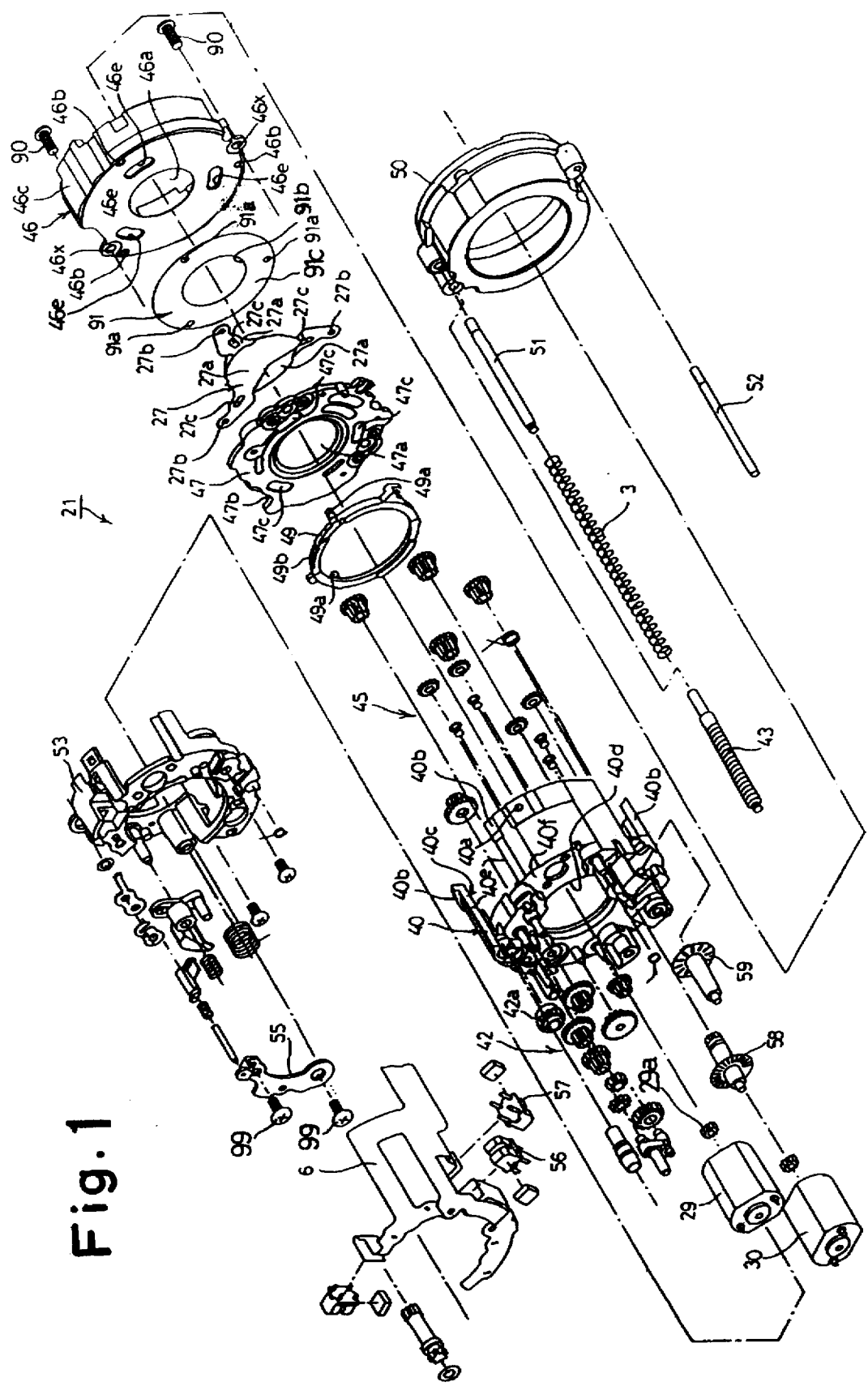
FIG. 1 is an exploded perspective view illustrating main parts of an AF/AE shutter unit of a zoom lens barrel.
Figure 2:
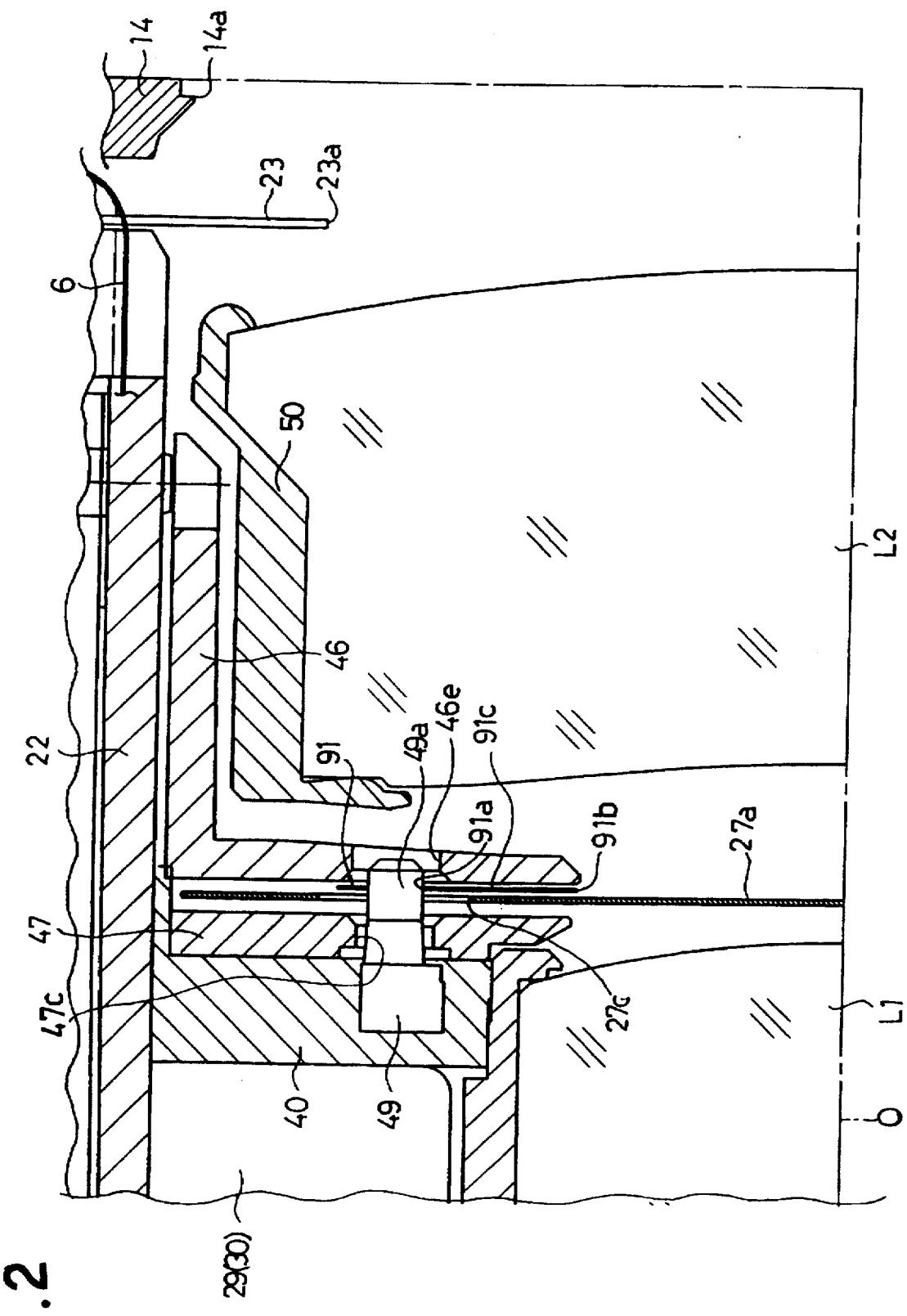
FIG. 2 is a sectional view of a part of the zoom lens barrel, showing a light interceptive structure of a lens shutter provided on the AF/AE shutter unit.

As illustrated in FIGS. 1 and 15, the AF/AE shutter unit 21 is provided with the shutter mounting state 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. The shutter mounting stage 40 supports the lens supporting barrel 34, the AE motor 29, and the rear lens group driving motor 30. The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft 43, photointerrupters 56 and 57 which are connected to a flexible printed circuit board 6, and rotating disks 58 and 59 which have a plurality of radially formed slits provided in the circumferential direction. An encoder for detecting whether the rear lens group driving motor 30 is rotating and for detecting an amount of rotation of the rear lens group driving motor 30 consists of the photointerrupter 57 and the rotating disk 59. An AE motor encoder for detecting whether the AE motor 29 is rotating and for detecting an amount of rotation of the AE motor 29 consists of the photointerrupter 56 and the rotating disk 58.

Figure 3:
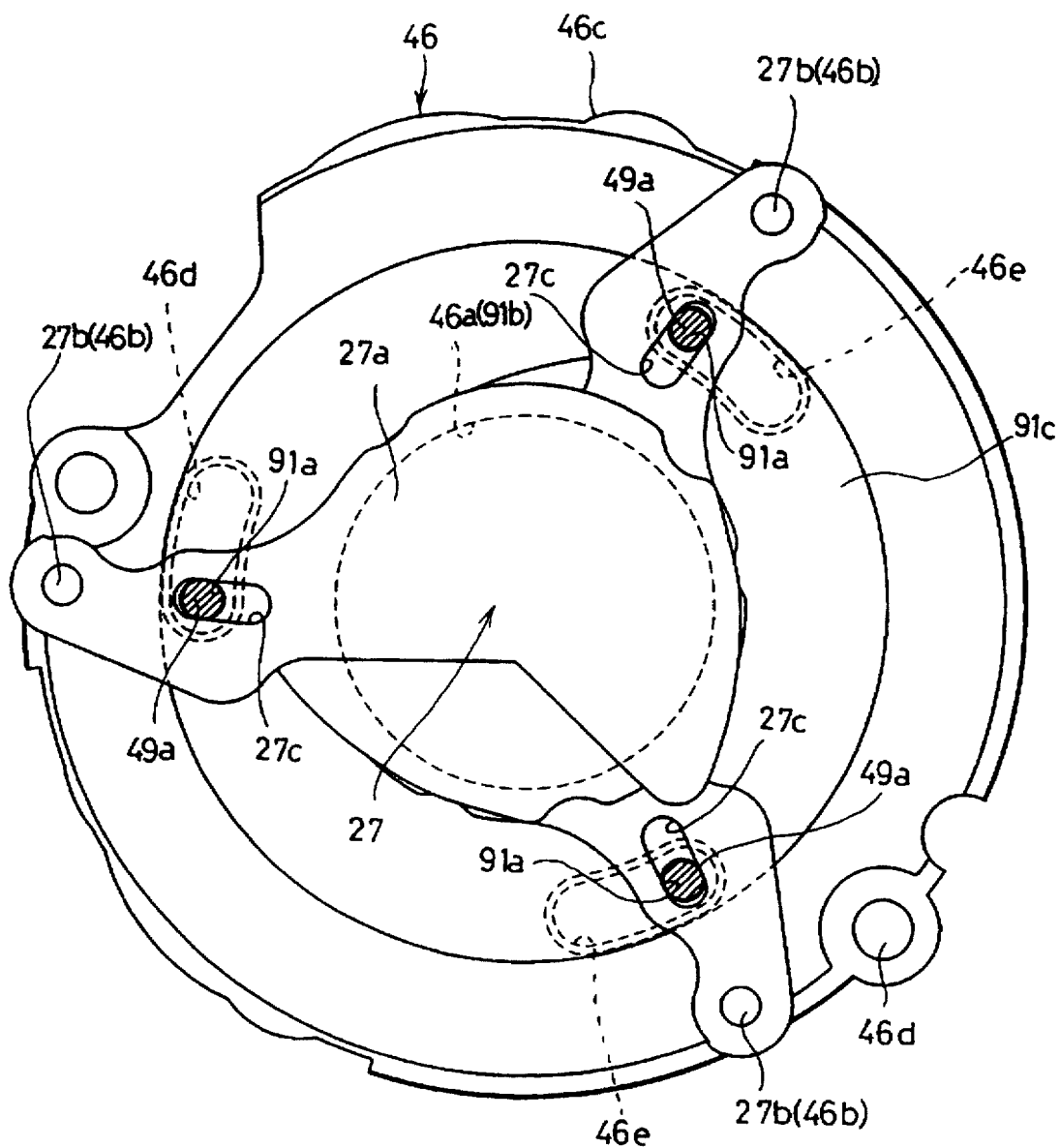
FIG. 3 is a front elevational view of a part of the AF/AE shutter unit, showing the light interceptive structure of the lens shutter.
Figure 4:
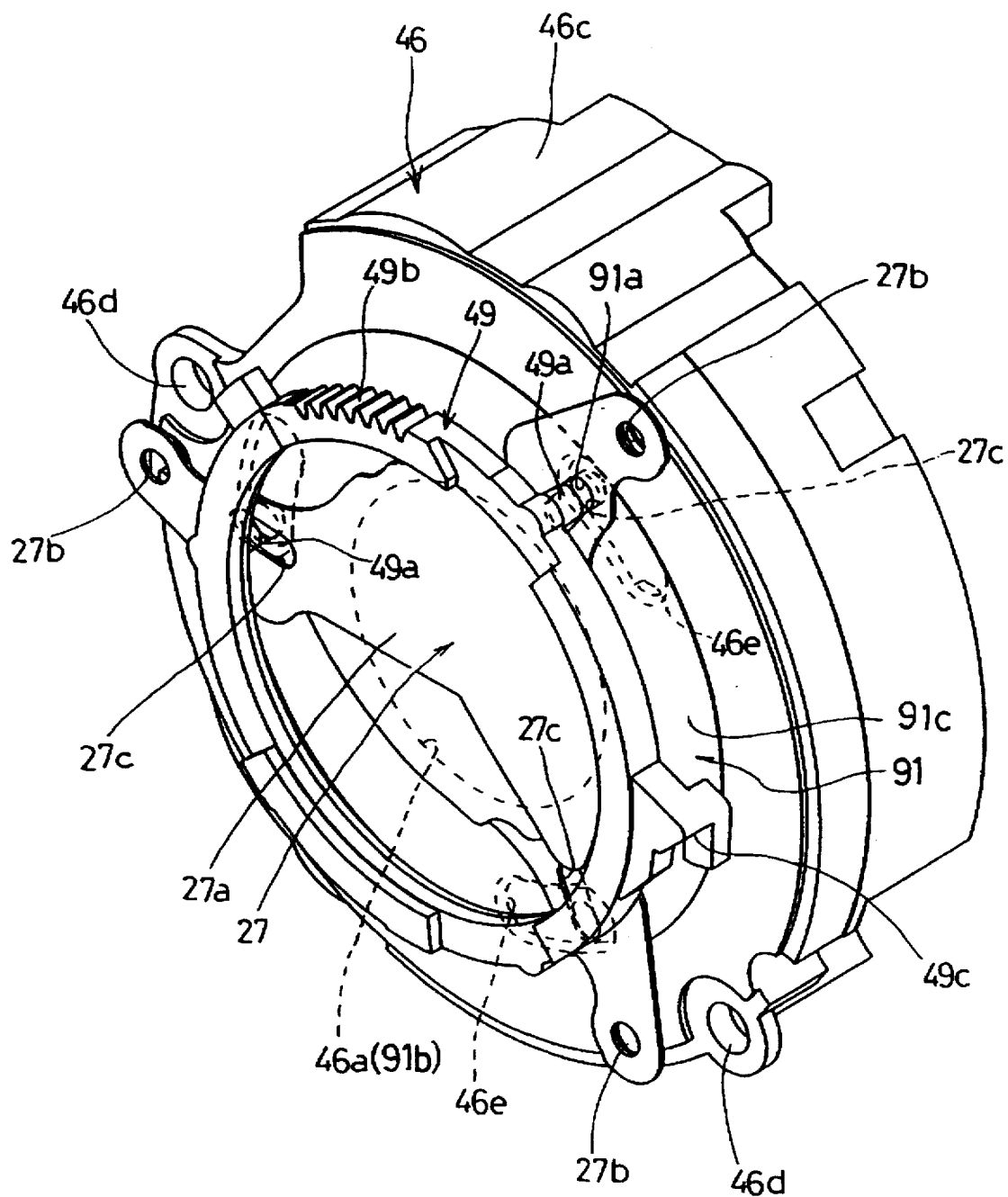
FIG. 4 is a perspective view of a part of the AF/AE shutter unit, showing the light interceptive structure of the lens shutter.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals. Each operating portion 49a engages with a slot or an elongated hole (opening) 27c formed on a corresponding one of the three shutter blades 27a (see FIGS. 3 and 4). A gear portion 49b is formed on a part of the outer periphery of the circular driving member 49. The gear portion 49b meshes with one of the plurality of gears in the gear train 45 to receive the rotation of the AE motor 29 through the gear train 45 and a driving pinion 29a of the AE motor 29. The circular driving member 49 rotates about the optical axis O in the forward and reverse directions when the AE motor 29 rotates in the forward and reverse directions, respectively. As shown in FIG. 1, the shutter blade supporting ring 46 is provide with three arc grooves 46e and three supporting holes 46b positioned at even (regular) angular intervals around the circular aperture 46a. Each of the arc grooves 46e is located along a common circle having a center coincident with the optical axis O. Two deflection restricting surfaces 46c are formed on the outer periphery of the shutter blade supporting ring 46. Each deflection restricting surface 46c is exposed outwardly from the corresponding linear guide 40c and slidably supports the inner peripheral faces of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 1) at respective positions opposite the three supporting holes 46b. Each shutter blade 27a is provided at one end thereof with a hole (rotational center) 27b into which the corresponding pivotal shaft 47b is inserted, so that each shutter blade 27a is rotatable about the corresponding pivotal shaft 47b. The major part of each shutter blade 27a, that extends normal to the optical axis O from the pivoted end, is formed as a light interceptive portion. All three light interceptive portions of the shutter blades 27a together prevent ambient light, which enters the front lens group L1, from entering the circular apertures 46a and 47a when the shutter blades 27a are closed. Each shutter blade 27a is further provided, between the hole 27b and the light interceptive portion thereof, with the aforementioned slot 27c, through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

The supporting member 47 is provided at respective positions close to the three pivotal shafts 47b with three arc grooves 47c each arched along a circumferential direction. The three operating projections 49a of the circular driving ring 49 engage with the slots 27c of the respective shutter blades 27a through the respective arc grooves 47c (see FIGS. 3 and 4). The shutter blade supporting ring 46 is inserted from the rear of the shutter mounting stage 40 to support the circular driving ring 49, the supporting member 47 and the shutter 27, and is fixed on the shutter mounting stage 40 by set screws 90 respectively inserted through holes 46x provided on the shutter blade supporting ring 46.

A ring-shaped light intercepting sheet 91 is provided between the shutter 27 and the shutter blade supporting ring 46. The light intercepting sheet 91 is made of an opaque elastic member of a synthetic resin which does not permit light to enter therethrough. Specifically, the light intercepting sheet 91 is made of a polyethylene terephthalate, but may be formed from other types of synthetic resins. The light intercepting sheet 91 is provided at a center thereof with a circular opening 91b and with a light intercepting portion 91c which surrounds the circular opening 91b. The circular opening 91b is formed to have a diameter substantially equal to that of the circular aperture 46a, and is equal to or more than that of a largest aperture formed by the shutter 27 being fully open.

The light intercepting sheet 91 is further provided at even angular intervals along a peripheral edge with three engaging holes 91a. The three operating projections 49a of the circular driving member 49 are respectively inserted into the three engaging holes 91a. Each engaging hole 91a is formed to have a substantially identical diameter to that of the corresponding operating projection 49a, so that each operating projection 49a is tightly fitted in the corresponding engaging hole 91a, without forming any substantial gap between each engaging hole 91a and the corresponding operating projection 49a.

The light intercepting sheet 91 is formed to be sufficiently large to surely prevent light from entering toward the rear lens group L2 through any of the slits 46e. In other words, the light intercepting sheet 91 is formed to have a diameter sufficiently larger than the diameter of the aforementioned common circle along which the arc grooves 46e are each located.

The operating projections 49a of the circular driving member 49 respectively engage with the engaging holes 91a through the arc grooves 47c and the slots 27c. The shutter blades 27a are each rotated about the pivotal shaft 47b thereof to open and close the shutter 27 when the circular driving member 49 is driven to rotate about the optical axis O in forward and reverse directions through the operating projections 49a and the slots 27c, respectively. Due to this structure, the circular driving member 49 together with the light intercepting sheet 91 rotates as a whole about the optical axis O when the circular driving member 49 is driven to rotate by the AE motor 29. Therefore, the light intercepting sheet 91 surely prevents light from passing through any of the slots 27c.

Figure 18:
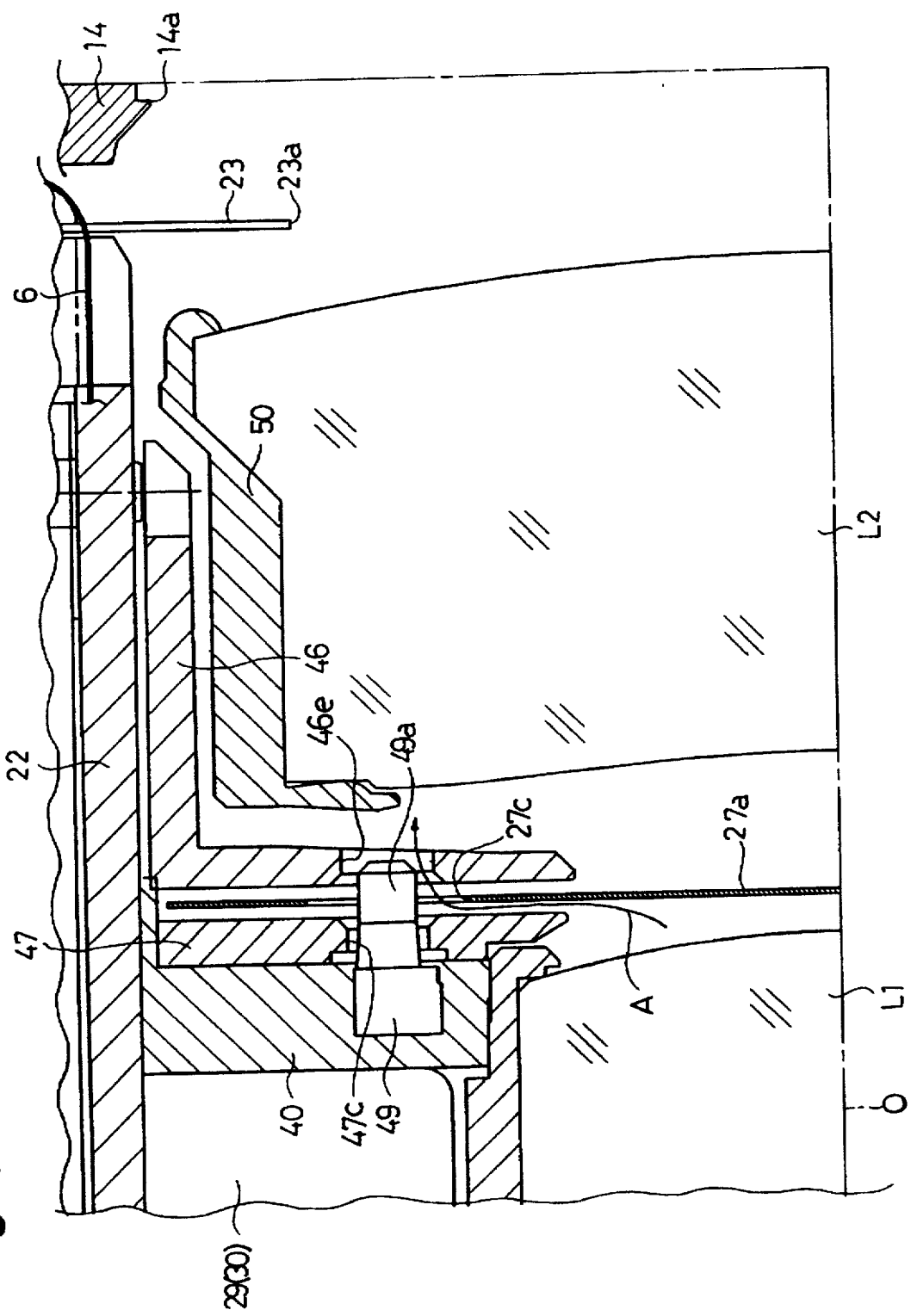
FIG. 18 is a sectional view of a part of the zoom lens barrel in the case where the light interceptive structure of the lens shutter is not provided, for comparison with FIG. 2.
Figure 19:
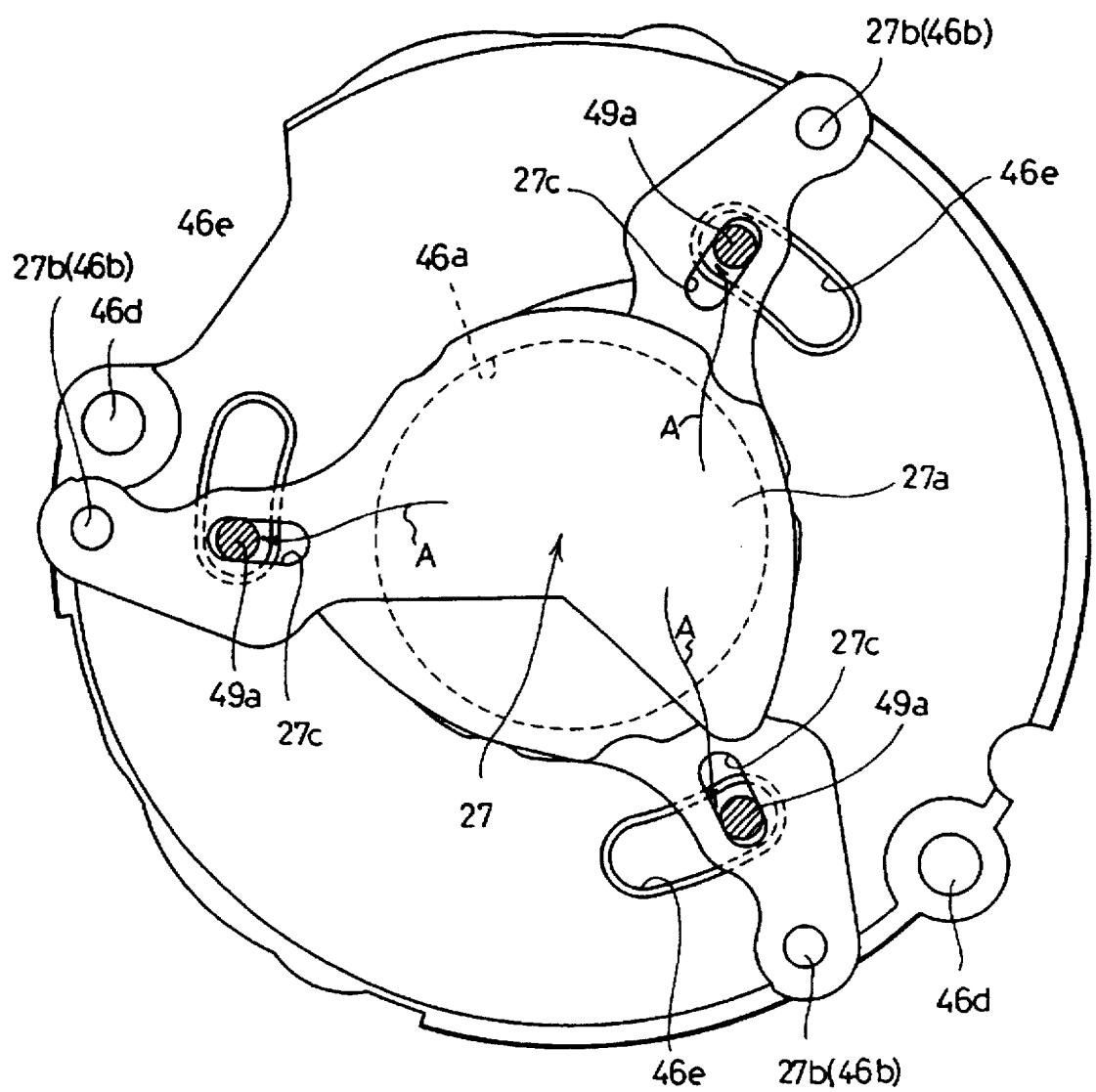
FIG. 19 is a front elevation view of a part of the AF/AE shutter unit in the case where the light interceptive structure of the lens shutter is not provided, for comparison with FIG. 3.

FIGS. 18 and 19 show a case where the light intercepting sheet 91 is not provided in the zoom lens barrel 10. Were it not for the light intercepting sheet 91, part of the light which has passed through the front lens group L1 might pass through the slots 27c and the slits 46e to advance toward the rear lens group L2, as shown by arrows "A" in FIGS. 18 and 19. However, such a problem never occurs in the zoom lens barrel 10 of the present embodiment which is provided with the light intercepting sheet 91. Since the light intercepting sheet 91 is merely a thin sheet member, no complicated assembling is necessary, and a space-efficient light intercepting structure for preventing light from coming through the slots 27c can be realized in the zoom lens barrel 10.

In the above-described embodiment of the zoom lens barrel 10, the light intercepting sheet 91 is positioned between the shutter 27 and the shutter blade supporting ring 46. However, the light intercepting sheet 91 may be positioned between the supporting member 47 and the shutter 27. A similar effect can also be obtained according to this other arrangement.

In the above-described embodiment of the zoom lens barrel 10, the light intercepting sheet 91 is provided as a single ring member, but may be replaced by a plurality of small light intercepting sheets. For instance, three small light intercepting sheets are provided instead of the light intercepting sheet 91, and each of the small light intercepting sheets is provided with an engaging hole which corresponds to the engaging hole 91a, so that the circular driving member 49 together with the three light intercepting sheets rotate as a whole about the optical axis O when the circular driving member 49 is driven to rotate by the AE motor 29. A similar effect can be obtained according to this arrangement.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring 3 fitted on the guide shaft 51, and therefore play between the shutter mounting stage 40 and the lens supporting barrel 50 is reduced. In addition, a driving gear 42a provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21, etc. are assembled, the aperture plate 23 is fixed to the rear of the linear guide barrel 17, and an annular retaining member 33 is fixed at the front of the fixed lens barrel block 12.

In the above-described embodiment of the zoom lens barrel 10, although the zoom lens optical system consists of two movable lens groups, i.e., the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Instead of adopting such a structure, the zoom lens barrel 10 may also be realized in such a manner by making the rear lens group L2 a member separate from the AF/AE shutter unit 21, which is provided with the shutter mounting stage 40, the circular driving member 49, the supporting member 47, the shutter blades 27, the shutter blade supporting ring 46 and the like, and that the rear lens group L2 is supported by a supporting member other than the AF/AE shutter unit 21.

In the zoom lens camera of the present embodiment, the operation by rotation of the whole optical unit driving motor 25 and the rear lens group driving motor 30 will now be described with reference to FIGS. 11, 12, 13 and 14.

As shown in FIGS. 12 or 14, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 integrally formed with the fixed lens barrel block 12, to rotate the third moving barrel 16 in one predetermined rotational direction to advance forwardly along the optical axis O. Therefore, the second moving barrel 19 and the first moving barrel 20 are each advanced by a small amount in the optical axis direction, along with the third moving barrel 16. Consequently, the camera is in a state capable of photographing, with the zoom lens positioned at the widest position, i.e., the wide end. At this stage, due to the fact that the amount of movement of the linear guide barrel 17 with respect to the fixed lens barrel block 12 is detected through the relative slide between the code plate 13a and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis O via the driving pinion 15 and the outer peripheral gear 16b. Therefore, the third moving barrel 16 is advanced from the fixed lens barrel block 12 according to the relationship between the female helicoid 12a and the male helicoid 16a. The linear guide barrel 17 moves forwardly in the optical axis direction together with the third moving barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relative rotation to the fixed lens barrel block 12, due to the above-noted structures in which the first moving barrel 20 is guided linearly by the linear guide member 22 and in which the follower pins 24 are guided by the lead grooves 19c. During such movements, according to the fact that the moving position of the linear guide barrel 17 with respect to the fixed lens barrel block 12 is detected through the relative slide between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, as in the case of advancing driving as above described, the rear lens group driving motor 30 is not driven.

Figure 11:
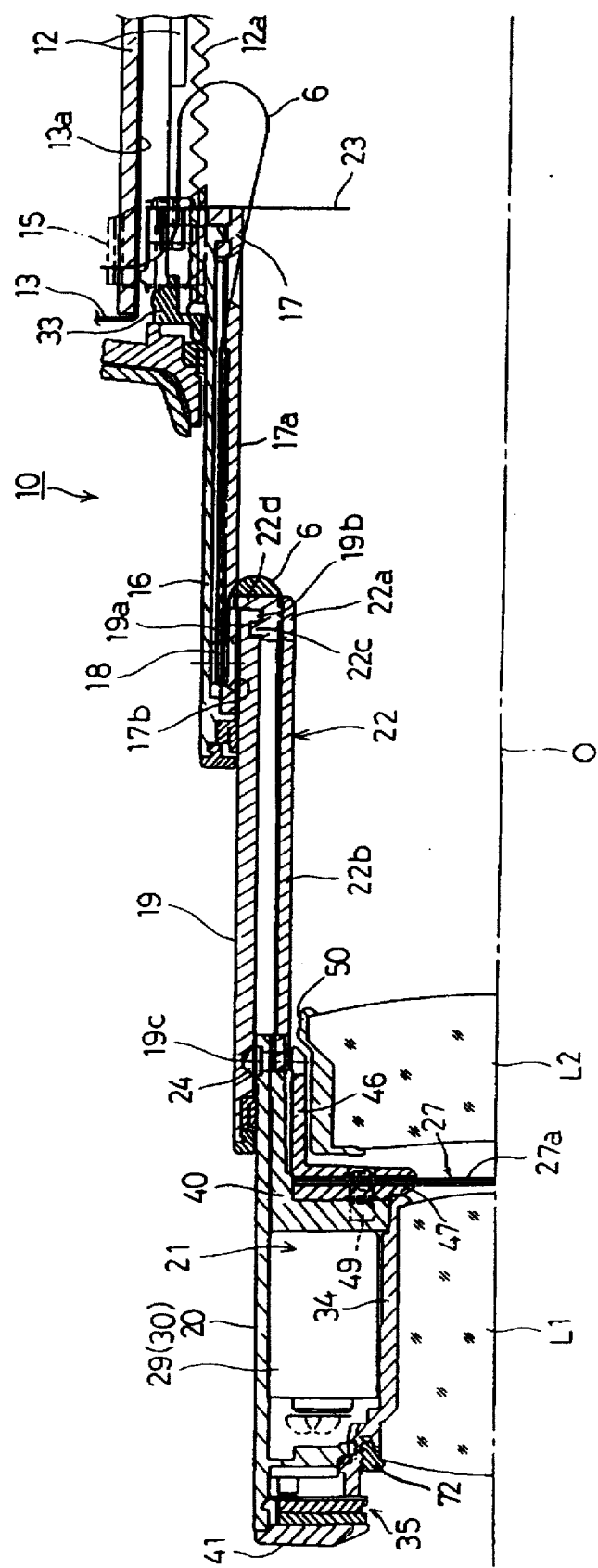
FIG. 11 is a sectional view of a n upper part of the zoom lens barrel in a maximum extended state.
Figure 13:
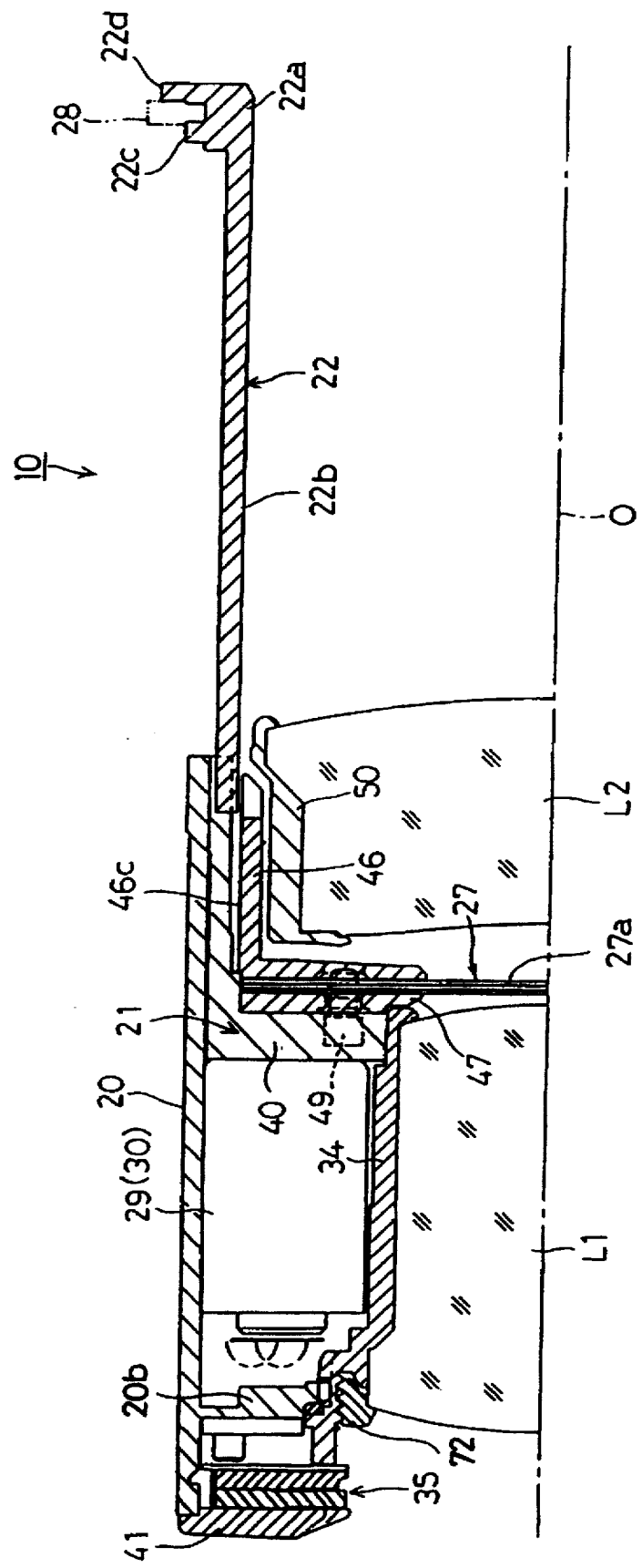
FIG. 13 is a sectional view of the upper part of the zoom lens barrel shown in FIG. 12 in the maximum extended state.

While the zoom lens barrel 10 is driven during the zooming operation, since the rear lens group driving motor 30 is not driven, the front lens group L1 and the rear lens group L2 move as a whole, maintaining a constant distance between each other, as shown in FIGS. 11 or 13. The focal length input via the zoom code plate 13a and the contacting terminal 9 is indicated on an LCD panel (not shown) provided on the camera body.

At any focal length set by the zoom operating device 62, when the release button is depressed by a half-step, the object distance measuring apparatus 64 is actuated to measure a current subject distance. At the same time the photometering apparatus 65 is actuated to measure a current subject brightness. Thereafter, when the release button is fully depressed, the whole optical unit driving motor 25 and the rear lens group driving motor 30 are each driven by respective amounts dictated according to the focal length information set in advance and the subject distance information obtained from the object distance measuring apparatus 64 so that the front and rear lens groups L1 and L2 are respectively moved to specified positions to obtain a specified focal length to bring the subject into focus. Immediately after the subject is brought into focus, the AE motor 29 is driven via the AE motor controller 66 to rotate the circular driving member 49 by an amount corresponding to the subject brightness information obtained from the photometering apparatus 65 so that the shutter 27 is driven to open the shutter blades 27a by a specified amount which satisfies the required exposure. Immediately after such a shutter release operation, in which the three shutter blades 27a are opened and subsequently closed, is completed, the whole optical unit driving motor 25 and the rear lens group driving motor 30 are both driven to move the front lens group L1 and the rear lens group L2 to the respective initial positions which they were at prior to a shutter release.

In the present embodiment of the zoom lens barrel 10, "Fantas Coat SF-6" is used as the coating 72e. However, a different type of coating may be used as the coating 72e as long as it is waterproof and makes the circular abutting surface 72b a smooth surface to form substantially no gap between the circular abutting surface 72b and the circumferential portion fp.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. A shutter arrangement for a camera, comprising:
   a plurality of shutter blades each having a rotational center and an opening formed proximate to said rotational center;
   a supporting member which supports each of said plurality of shutter blades to be rotatable about said rotational center;
   a ring member driven to rotate about an optical axis of a photographic lens, said ring member comprising a plurality of pins each engaging with a corresponding one of said openings; and
   a light intercepting sheet provided with a plurality of holes in which said plurality of pins are respectively inserted, so that said ring member and said light intercepting sheet rotate together as a whole about said optical axis when said ring member is driven to rotate.

2. The shutter arrangement according to claim 1, wherein each of said plurality of holes is smaller than a corresponding one of said openings.

3. The shutter arrangement according to claim 1, wherein said light intercepting sheet is formed in the shape of a ring which surrounds a photographic light path of said photographic lens.

4. The shutter arrangement according to claim 1, wherein said supporting member, said plurality of shutter blades and said light intercepting sheet are positioned in this order in a direction of said optical axis from an object side towards an image side.

5. The shutter arrangement according to claim 1, wherein said supporting member, said light intercepting sheet and said plurality of shutter blades are positioned in this order in a direction of said optical axis from an object side towards an image side.

6. The shutter arrangement according to claim 1, wherein said ring member is positioned in front of said supporting member.

7. The shutter arrangement according to claim 1, further comprising a plurality of pivotal shafts formed on said supporting member, and a plurality of pivotal holes each formed at a corresponding one of said rotational centers of said plurality of shutter blades, wherein said plurality of pivotal shafts are respectively inserted in said plurality of pivotal holes.

8. The shutter arrangement according to claim 1, wherein said light intercepting sheet is made of an opaque elastic member comprising a synthetic resin.

9. The shutter arrangement according to claim 1, wherein said plurality of shutter blades are opened and closed when said ring member is driven to rotate about said optical axis in forward and reverse rotational directions, respectively.

10. The shutter arrangement according to claim 1, wherein each of said plurality of holes is formed to have a diameter substantially equal to that of a corresponding one of said plurality of pins.

11. The shutter arrangement according to claim 1, wherein said light intercepting sheet comprises a plurality of light intercepting sheets provided with said plurality of holes, respectively.

12. A shutter arrangement for a camera, comprising:

a shutter supporting annular member having a plurality of pivotal shafts extending in a direction of an optical axis of said photographic lens;

a plurality of shutter blades, each of said plurality of shutter blades being pivoted at a corresponding one of said plurality of pivotal shafts, said plurality of shutter blades each defining an elongated hole;

a ring member driven to rotate about said optical axis, said ring member comprising a plurality of pins each engaging with a corresponding one of said elongated holes; and a ring-shaped light intercepting sheet provided with a plurality of holes in which said plurality of pins are respectively inserted, so that said ring member and said light intercepting sheet rotate together about said optical axis when said ring member is driven to rotate.

13. A shutter arrangement for a camera, comprising:

at least one shutter blade comprising a rotational center and an opening formed proximate to said rotational center;

a supporting member which supports said at least one shutter blade to be rotatable about said rotational center;

a ring member driven to rotate about an optical axis of a photographic lens, said ring member comprising at least one pin engaging with said opening; and a light intercepting sheet provided with at least one hole in which said at least one pin is tightly inserted, so that said ring member and said light intercepting sheet rotate together about said optical axis when said ring member is driven to rotate.

* * * * *